(12) United States Patent
Lee

(10) Patent No.: US 12,550,477 B2
(45) Date of Patent: Feb. 10, 2026

(54) LIGHT EMITTING DEVICE FOR DISPLAY AND DISPLAY APPARATUS

(71) Applicant: Seoul Viosys Co., Ltd., Ansan-si (KR)

(72) Inventor: Chung Hoon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 667 days.

(21) Appl. No.: 17/862,343

(22) Filed: Jul. 11, 2022

(65) Prior Publication Data
US 2022/0352413 A1 Nov. 3, 2022

Related U.S. Application Data

(63) Continuation of application No. 16/788,605, filed on Feb. 12, 2020, now Pat. No. 11,387,383.

(60) Provisional application No. 62/805,545, filed on Feb. 14, 2019.

(51) Int. Cl.
H01L 25/075 (2006.01)
H10H 20/01 (2025.01)

(52) U.S. Cl.
CPC ......... *H10H 20/01* (2025.01); *H01L 25/0756* (2013.01); *H01L 2221/68363* (2013.01); *H01L 2221/68368* (2013.01); *H01L 2224/27003* (2013.01); *H10H 20/0364* (2025.01)

(58) Field of Classification Search
None
See application file for complete search history.

(56) References Cited

U.S. PATENT DOCUMENTS

| 10,096,740 B1 | 10/2018 | Chen |
| 10,163,869 B2 | 12/2018 | Zou et al. |
| 10,784,465 B2 | 9/2020 | Ikeda et al. |
| 10,871,669 B2 | 12/2020 | Yamazaki et al. |

(Continued)

FOREIGN PATENT DOCUMENTS

| JP | 2007-208129 | 8/2007 |
| JP | 2009-260226 | 11/2009 |

(Continued)

OTHER PUBLICATIONS

Non-Final Office Action dated Apr. 23, 2021, issued to U.S. Appl. No. 16/788,605.

(Continued)

*Primary Examiner* — Jay C Chang
(74) *Attorney, Agent, or Firm* — Oblon, McClelland, Maier & Neustadt, L.L.P.

(57) ABSTRACT

A light emitting display including a circuit board, a plurality of light emitting devices arranged on the circuit board each including a first, LED stack, a second LED stack, and a third LED stack, a bump pad disposed between the circuit board and the light emitting device, the bump pad comprising Au material, and an encapsulating layer comprising an optical interference preventing material and covering the light emitting devices, in which the circuit board includes an interconnection line and a plurality of pads disposed on an upper surface thereof to provide electrical connection, the first, second, and third LED stacks are stacked in a vertical direction, one of the LED stacks configured to emit light having the longest wavelength among the first, second, and third LED stacks is in ohmic contact with the Au material, and the bump pad has an irregular upper surface.

20 Claims, 51 Drawing Sheets

(56) References Cited

U.S. PATENT DOCUMENTS

| | | | |
|---|---|---|---|
| 2010/0295177 A1* | 11/2010 | Ouchi | H05K 3/3436 |
| | | | 257/737 |
| 2015/0001561 A1 | 1/2015 | Katsuno et al. | |
| 2015/0144906 A1* | 5/2015 | Ichikawa | H10K 59/80522 |
| | | | 438/34 |
| 2017/0098579 A1 | 4/2017 | Oba et al. | |
| 2017/0162746 A1* | 6/2017 | Cha | H10H 20/812 |
| 2017/0288093 A1* | 10/2017 | Cha | H10H 20/8312 |

FOREIGN PATENT DOCUMENTS

| | | |
|---|---|---|
| JP | 2011-096929 | 5/2011 |
| KR | 10-2015-0003676 | 1/2015 |
| KR | 10-2017-0079940 | 7/2017 |
| WO | 2017066921 | 4/2017 |

OTHER PUBLICATIONS

Non-Final Office Action dated Jun. 15, 2021, issued to U.S. Appl. No. 16/788,605.
Final Office Action dated Dec. 13, 2021, issued to U.S. Appl. No. 16/788,605.
Notice of Allowance dated Mar. 10, 2022, issued to U.S. Appl. No. 16/788,605.
Extended European Search Report dated Oct. 11, 2022, issued to European Patent Application No. 20755148.2.

* cited by examiner

LIGHT EMITTING DEVICE FOR DISPLAY AND DISPLAY APPARATUS

CROSS-REFERENCE TO RELATED APPLICATIONS

This application is a continuation of U.S. patent application Ser. No. 16/788,605, filed on Feb. 12, 2020, which claims the benefit of U.S. Provisional Application No. 62/805,545, filed on Feb. 14, 2019, each of which is hereby incorporated by reference for all purposes as if fully set forth herein.

BACKGROUND

Field

Exemplary embodiments of the invention relate generally to a method of transferring a light emitting device for display and a display apparatus having the same, more specifically, to a method of transferring a plurality of light emitting devices for display and a display apparatus having a transferred light emitting device.

Discussion of the Background

As an inorganic light source, light emitting diodes have been used in various fields including displays, vehicular lamps, general lighting, and the like. With various advantages of the light emitting diodes, such as long lifespan, low power consumption, and rapid response, the light emitting diodes have been replacing conventional light sources.

Conventional light emitting diodes have been typically used as backlight light sources in display apparatuses. However, LED displays that display images directly using light emitting diodes have been recently developed.

In general, a display apparatus displays various colors through mixture of blue, green, and red light. In order to realize various images, the display apparatus includes a plurality of pixels, each including sub-pixels corresponding to blue, green, and red light, respectively. As such, a color of a certain pixel is determined based on the colors of the sub-pixels, and images can be realized through combination of such pixels.

Since LEDs can emit various colors depending upon materials thereof, it is possible to provide a display apparatus by arranging individual LED chips emitting blue, green, and red light on a two-dimensional plane. To this end, a plurality of LED chips may need to be transferred onto a display panel substrate at an interval that matches an interval between pixels.

In general, a plurality of LED chips is manufactured on one wafer, and these LED chips are divided into individual LED chips through a scribing and breaking processes on the wafer. After the braking process, an interval between the LED chips may be adjusted by an expansion of a tape, and these LED chips may be rearranged on a transfer tape. The rearranged LED chips may be transferred to a panel substrate using the transfer tape. In this case, due to a large number of pixels used in a display apparatus, the LED chips rearranged on the transfer tape are transferred to the panel substrate in a group. However, rearranging the LED chips on the transfer tape cannot be transferred from the wafer in a group, and requires arranging the LED chips individually, which may consume significant time associated with these rearrangement process.

Moreover, since the LED chips may need to be arranged in each sub-pixel, the number of LED chips to be mounted increases, thereby consuming more time for the mounting process.

Meanwhile, since the sub-pixels are arranged on the two-dimensional plane in the display apparatus, a relatively large area is occupied by one pixel including the sub-pixels for blue, green, and red light. As such, an area of each subpixel must be reduced so as to arrange the sub-pixels in a restricted area. However, reducing the size of the LED chip may cause the mount of the LED chip difficult, and, furthermore, may reduce a luminous area of the LED chip.

The above information disclosed in this Background section is only for understanding of the background of the inventive concepts, and, therefore, it may contain information that does not constitute prior art.

SUMMARY

Display apparatus and transferring methods according to exemplary embodiments of the invention are capable of shortening a mounting process time.

Exemplary embodiments provide a method of easily transferring a light emitting device on a wafer to a circuit board in a group.

Exemplary embodiments also provide a light emitting device for display having an increased area of each sub-pixel within a limited pixel area.

Additional features of the inventive concepts will be set forth in the description which follows, and in part will be apparent from the description, or may be learned by practice of the inventive concepts.

A method of transferring a light emitting device according to an exemplary embodiment includes the steps of preparing a wafer including a substrate, semiconductor layers disposed on the substrate, and bump pads disposed on the semiconductor layers and arranged in a plurality of light emitting device regions, dividing the wafer into a plurality of light emitting devices while the light emitting devices are in close contact with each other, attaching the light emitting devices to a transfer tape disposed on a supporting substrate, such that the substrate contacts the transfer tape, preparing a circuit board including pads arranged thereon, adjoining the supporting substrate with the circuit board, so that the bump pads of at least one light emitting device contact the pads of the circuit board, bonding the at least one light emitting device to the pads by applying heat to the bump pads and the pads, and separating the at least one light emitting device bonded to the pads from the transfer tape.

Dividing the wafer into the plurality of light emitting devices may include forming scribing grooves on the wafer through laser scribing, attaching the wafer on a breaking tape, and dividing the wafer along the scribing grooves.

Attaching the light emitting devices to the transfer tape may include transferring the light emitting devices attached on the breaking tape to a temporary substrate while the light emitting devices are in close contact with each other, and transferring the light emitting devices to the transfer tape from the temporary substrate.

The wafer may be divided into the plurality of light emitting devices using a laser without a breaking process.

The light emitting devices bonded to the pads of the circuit board may be separated from the transfer tape at a first temperature higher than room temperature.

The first temperature may be substantially the same as a bonding temperature for bonding the bump pads of the light emitting devices to the pads of the circuit board.

When separating the light emitting devices bonded to the pads from the transfer tape, an adhesive force between the transfer tape and the light emitting device may be less than that between the bump pads and the pads.

The transfer tape may have a smaller adhesive force at a bonding temperature for bonding the bump pads of the light emitting devices to the pads of the circuit board than at room temperature.

An interval between the light emitting devices transferred onto the circuit board may be greater than a width of one light emitting device.

An interval between the light emitting devices transferred onto the circuit board may be constant.

The semiconductor layers may include semiconductor layers of a first LED stack, semiconductor layers of a second LED stack, and semiconductor layers of a third LED stack that overlap one another.

The second LED stack may be disposed between the first LED stack and the third LED stack, the third LED stack may be disposed closer to the substrate than the first LED stack, each of the first, second, and third LED stacks may include a first conductivity type semiconductor layer, an active layer, and a second conductivity type semiconductor layer, the bump pads may include first, second, third bump pads and a common bump pad, the common bump pad may be commonly electrically connected to the first, second, and third LED stacks, and the first, second, and third bump pads may be electrically connected to the first, second, and third LED stacks, respectively.

The bump pads may be disposed on the first LED stack.

The first, second, and third LED stacks may emit red light, green light, and blue light, respectively.

The light emitting device may further include a first transparent electrode interposed between the first LED stack and the second LED stack, and being in ohmic contact with a lower surface of the first LED stack, a second transparent electrode interposed between the first LED stack and the second LED stack, and being in ohmic contact with an upper surface of the second LED stack, a third transparent electrode interposed between the second LED stack and the third LED stack, and being in ohmic contact with an upper surface of the third LED stack, a first electrode pad disposed on the first conductivity type semiconductor layer of the third LED stack, a lower second electrode pad disposed on the third transparent electrode, in which an upper surface of the first electrode pad may be located at substantially the same elevation as that of the lower second electrode pad.

Each of the first, second, and third transparent electrodes may contact the corresponding second conductivity type semiconductor layer, and at least one of the first, second, and third transparent electrodes may be recessed from an edge of the second conductivity type semiconductor layer of the first, second, and third LED stacks.

The common bump pad may be commonly electrically connected to first conductivity type semiconductor layers of the first, second, and third LED stacks, and the first, second, and third bump pads may be electrically connected to second conductivity type semiconductor layers of first, second, and third LED stacks, respectively.

The light emitting device may further include a first bonding layer interposed between the second LED stack and the third LED stack, and a second bonding layer interposed between the first LED stack and the second LED stack.

A display apparatus according to another exemplary embodiment includes a circuit board including pads formed on an upper surface thereof, a plurality of light emitting devices arranged on the circuit board, each of the light emitting devices including a first LED stack, a second LED stack disposed on the first LED stack, a third LED stack disposed on the second LED stack, a substrate disposed on the third LED stack, and bump pads disposed between the first LED stack and the circuit board, in which the bump pads are bonded to the pads, and the bump pads and the pads are bonded with at least one of In, Pb, AuSn, and CuSn.

The substrate may be a growth substrate on which the third LED stack is grown.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
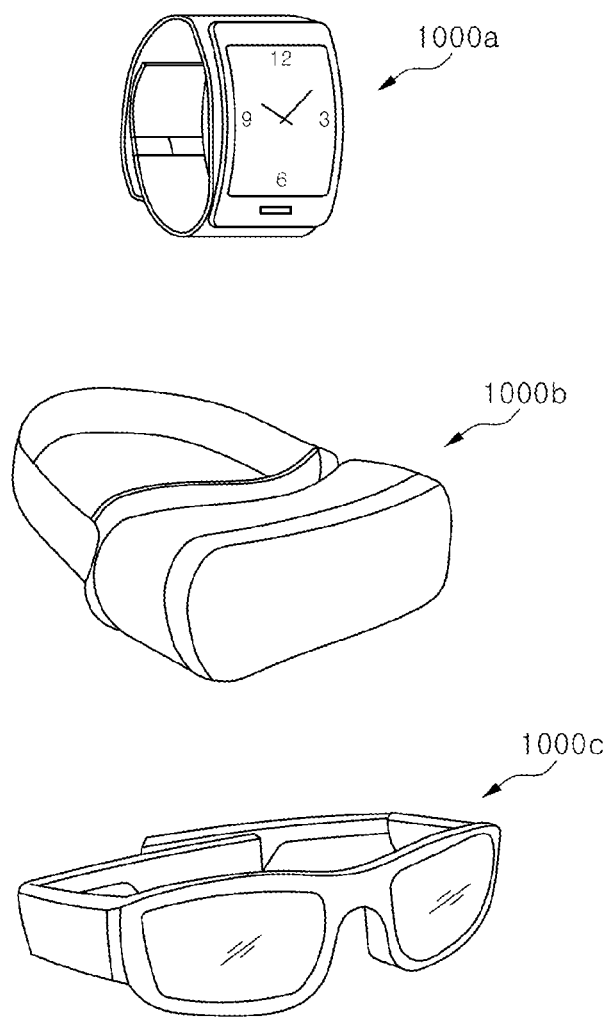
FIG. 1 shows schematic perspective views illustrating display apparatuses according to exemplary embodiments.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings.

FIG. 1 shows schematic perspective views illustrating display apparatuses according to exemplary embodiments.

The light emitting device according to exemplary embodiments may be used in a VR display apparatus, such as a smart watch 1000*a* or a VR headset 1000*b*, or an AR display apparatus, such as augmented reality glasses 1000*c*, without being limited thereto.

Figure 2:
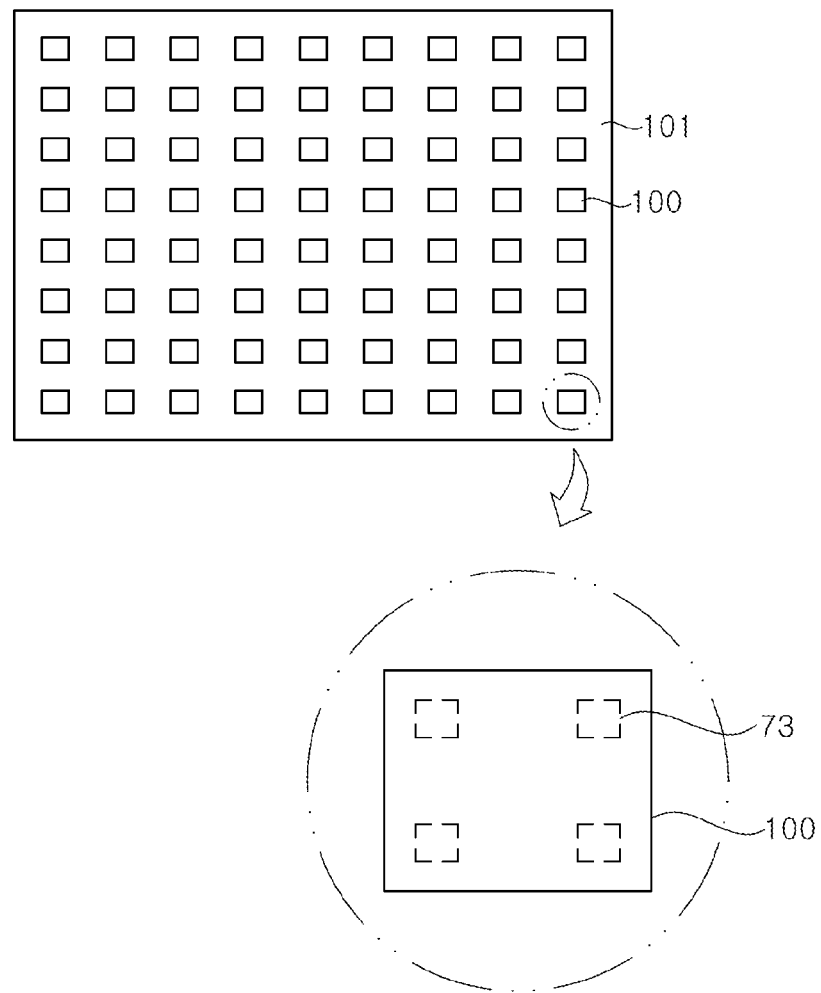
FIG. 2 is a schematic plan view illustrating a display panel according to an exemplary embodiment.

A display panel for implementing an image is mounted on the display apparatus. FIG. 2 is a schematic plan view illustrating the display panel according to an exemplary embodiment.

Referring to FIG. 2, the display panel includes a circuit board 101 and light emitting devices 100.

The circuit board 101 (or a panel substrate) may include a circuit for passive matrix driving or active matrix driving. In one exemplary embodiment, the circuit board 101 may include interconnection lines and resistors. In another exemplary embodiment, the circuit board 101 may include interconnection lines, transistors, and capacitors. The circuit board 101 may also have pads disposed on an upper surface thereof to allow electrical connection to the circuit therein.

A plurality of light emitting devices 100 are arranged on the circuit board 101. Each of the light emitting devices 100 may form one pixel. The light emitting device 100 includes bump pads 73, and the bump pads 73 are electrically connected to the circuit board 101. For example, the bump pads 73 may be bonded to pads exposed on the circuit board 101.

An interval between the light emitting devices 100 may be greater than a width of the light emitting device.

Figure 3A:
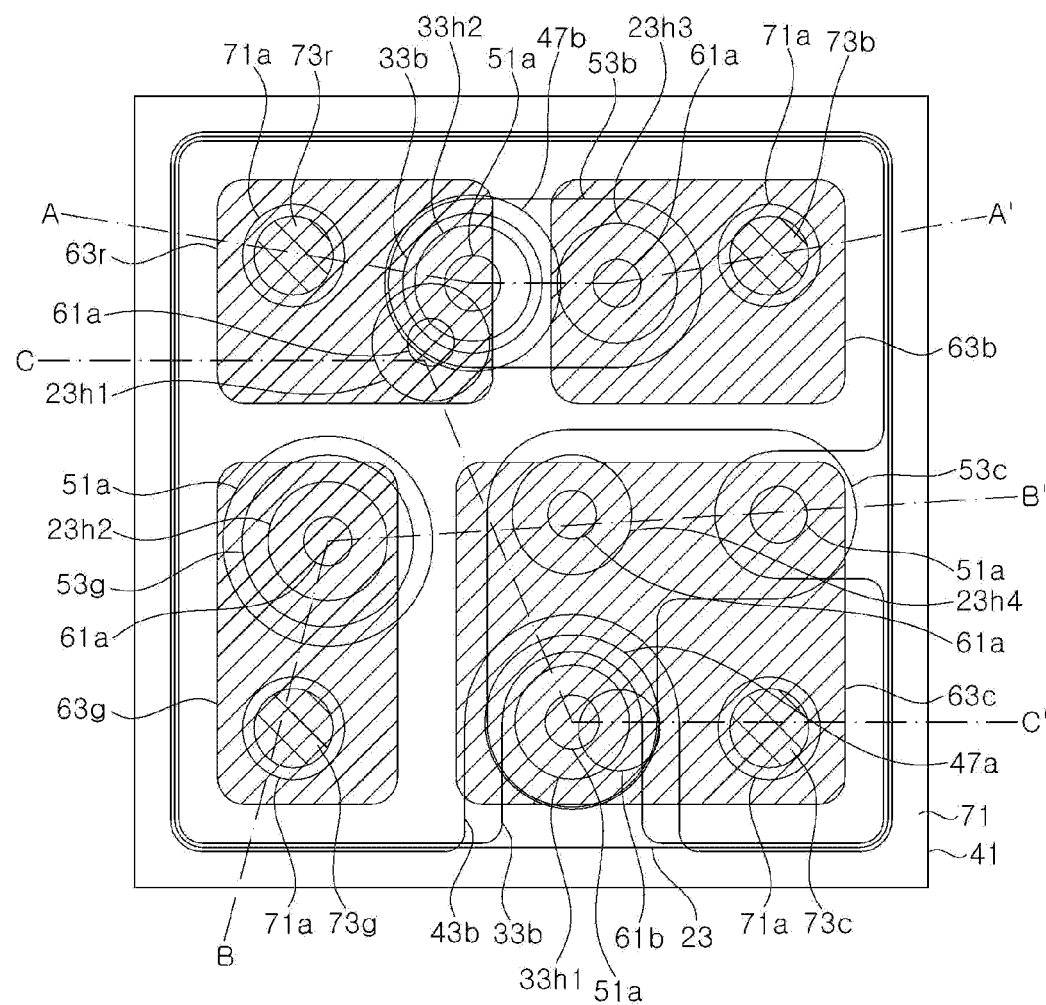
FIG. 3A is a schematic plan view of a light emitting device according to an exemplary embodiment.
Figure 3B:
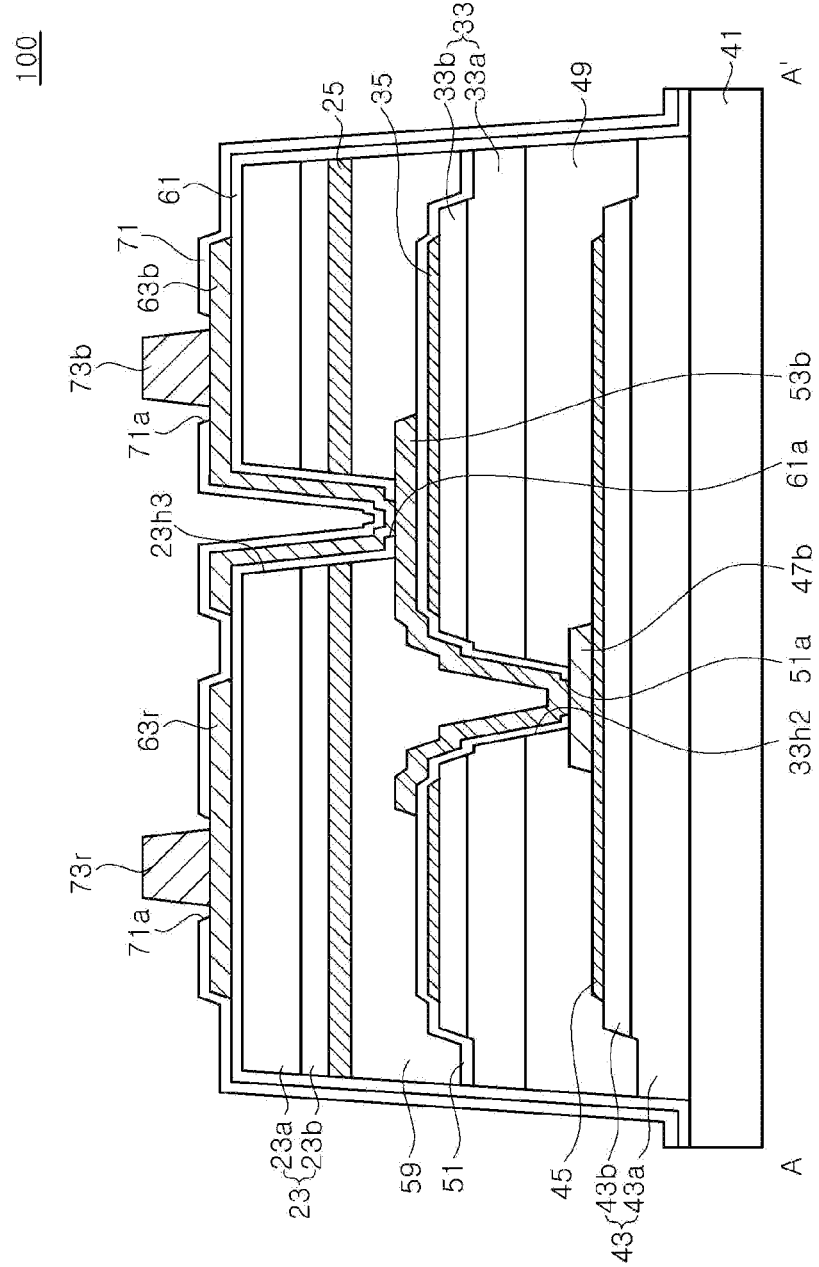
FIG. 3B, FIGS. 3C, and 3D are schematic cross-sectional views taken along the lines A-A', B-B', and C-C' of FIG. 3A, respectively
Figure 3C:
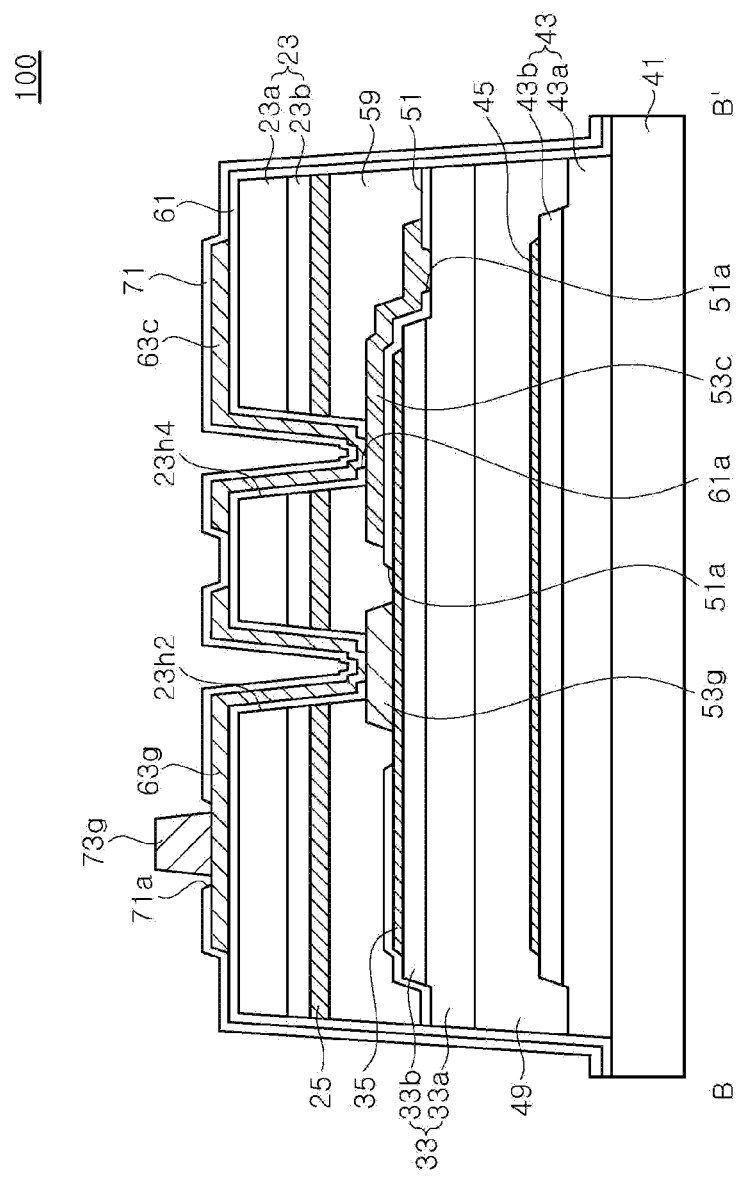
Figure 3D:
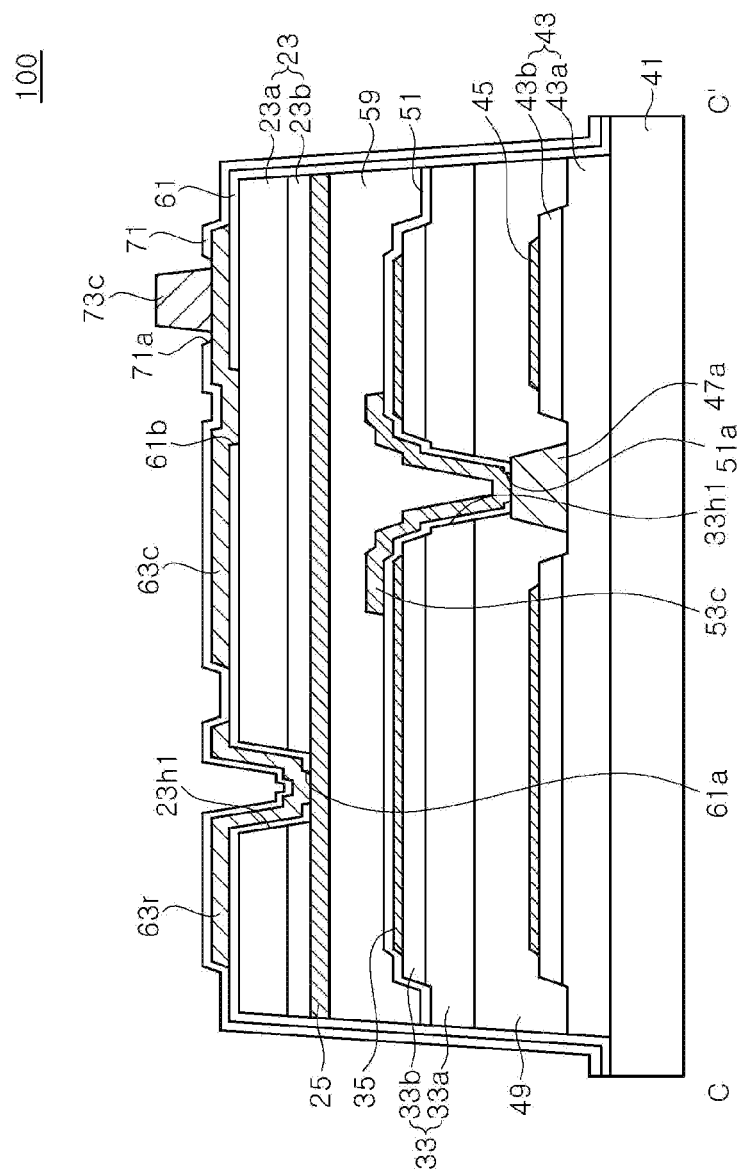

A specific configuration of the light emitting device 100 will be described with reference to FIG. 3A, FIG. 3B, FIG. 3C, and FIG. 3D. FIG. 3A is a schematic plan view illustrating the light emitting device 100 according to an exemplary embodiment, and FIG. 3B, FIG. 3C, and FIG. 3D are schematic cross-sectional views taken along lines A-A', B-B', and C-C' of FIG. 3A.

Hereinafter, although bump pads 73r, 73b, 73g, and 73c are exemplarily illustrated as being disposed on an upper side in FIG. 3A, FIG. 3B, FIG. 3C, and FIG. 3D, in some exemplary embodiment, the light emitting device 100 may be flip-bonded on the circuit board 101 shown in FIG. 2. In this case, the bump pads 73r, 73b, 73g, and 73c may be disposed at a lower side of the structure.

Referring to FIG. 3A, FIG. 3B, FIG. 3C, and FIG. 3D, the light emitting device 100 may include a substrate 41, a first LED stack 23, a second LED stack 33, a third LED stack 43, a first transparent electrode 25, a second transparent electrode 35, a third transparent electrode 45, an n-electrode pad 47a, a lower p-electrode pad 47b, an upper p-electrode pad 53g, a lower p-connector 53b, a lower common connector 53c, an upper common connector 63c, a first upper connector 63r, a second upper connector 63g, a third upper connector 63b, a first bonding layer 49, a second bonding layer 59, a lower insulation layer 51, an intermediate insulation layer 61, an upper insulation layer 71, and bump pads 73r, 73b, 73g, and 73c. Furthermore, the light emitting device 100 may include through holes 23h1, 23h2, 23h3, and 23h4 passing through the first LED stack 23, and through holes 33h1 and 33h2 passing through the second LED stack 33.

The substrate 41 may be a gallium nitride substrate, a SiC substrate, a sapphire substrate, or a patterned sapphire substrate. The substrate 41 may be a growth substrate used to grow the third LED stack 43.

As shown in FIG. 3B, the first to third LED stacks 23, 33, and 43 are stacked in the vertical direction. Although the LED stacks 23, 33, and 43 are grown on different growth substrates from each other, according to an exemplary embodiment, the growth substrates except the substrate 41 may be removed from the final light emitting device 100. However, the inventive concepts are not limited thereto, and in some exemplary embodiments, each growth substrate may be removed from the final light emitting device 100 or at least two growth substrates may be retained in the final light emitting device 100.

Each of the first LED stack 23, the second LED stack 33, and the third LED stack 43 includes a first conductivity type semiconductor layer 23a, 33a, or 43a, a second conductivity type semiconductor layer 23b, 33b, or 43b, and an active layer interposed therebetween. The active layer may have a multiple quantum well structure.

The second LED stack 33 is disposed under the first LED stack 23, and the third LED stack 43 is disposed under the second LED stack 33. In the illustrated exemplary embodiment, the second LED stack 33 is described as being disposed under the first LED stack 23, and the third LED stack 43 is described as being disposed under the second LED stack 33, but in some exemplary embodiments, the light emitting device may be flip-bonded. In this case, upper and lower positions of these first to third LED stacks may be reversed.

Light generated in the first to third LED stacks 23, 33, and 43 is emitted to the outside through the third LED stack 43 and the substrate 41.

In an exemplary embodiment, the first LED stack 23 may emit light having a longer wavelength than those emitted from the second and third LED stacks 33 and 43, and the second LED stack 33 may emit light having a longer wavelength than that emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode emitting blue light. The first LED stack 23 may include an AlGaInP-based well layer, the second LED stack 33 may include an AlGaInP or AlGaInN-based well layer, and the third LED stack 43 may include an AlGaInN-based well layer.

Since the first LED stack 23 emits light having a longer wavelength than those emitted from the second and third LED stacks 33 and 43, light generated from the first LED stack 23 may be emitted outside after passing through the second and third LED stacks 33 and 43. In addition, since the second LED stack 33 emits light having a longer wavelength than that emitted from the third LED stack 43, light generated from the second LED stack 33 may be emitted outside after passing through the third LED stack 43.

In another exemplary embodiment, the first LED stack 23 may emit light having a longer wavelength than those emitted from the second and third LED stacks 33 and 43, and the second LED stack 33 may emit light having a shorter wavelength than that emitted from the third LED stack 43. For example, the first LED stack 23 may be an inorganic light emitting diode emitting red light, the second LED stack 33 may be an inorganic light emitting diode emitting blue light, and the third LED stack 43 may be an inorganic light emitting diode emitting green light. In this case, the first LED stack 23 may include an AlGaInP-based well layer, the second LED stack 33 may include an AlGaInN-based well layer, and the third LED stack 43 may be an AlGaInP-based or AlGaInN based well layer, for example.

A portion of light generated in the second LED stack 33 may be absorbed in the third LED stack 43, and thus, luminous intensity of light emitted from the second LED stack 33 may be relatively lower than that of light emitted from the first or third LED stacks 23 or 43. Accordingly, a ratio of luminance intensity of light emitted from the first to third LED stacks 23, 33, and 43 may be controlled.

According to an exemplary embodiment, the first conductivity type semiconductor layer 23a, 33a, and 43a of each of the LED stacks 23, 33, and 43 may be an n-type semiconductor layer, and the second conductivity type semiconductor layer 23b, 33b, and 43b thereof may be a p-type semiconductor layer. In particular, in the illustrated exemplary embodiment, an upper surface of the first LED stack 23 is an n-type semiconductor layer 23a, an upper surface of the second LED stack 33 is a p-type semiconductor layer 33b, and an upper surface of the third LED stack 43 is a p-type semiconductor layer 43b. That is, the first LED stack 23 has a stacked sequence of semiconductor layers different from those of the second and third LED stacks 33 and 43. The semiconductor layers of the second LED stack 33 are stacked in the same order as the semiconductor layers of the third LED stack 43, and thus, process stability may be ensured. This will be described in detail later with reference to a manufacturing method.

The second LED stack 33 includes a mesa etching region in which the second conductivity type semiconductor layer 33b is removed to expose an upper surface of the first conductivity type semiconductor layer 33a. The third LED stack 43 also includes a mesa etching region in which the second conductivity type semiconductor layer 43b is removed to expose an upper surface of the first conductivity type semiconductor layer 43a. In contrast, the first LED stack 23 does not include a mesa etching region. The through holes 33h1 and 33h2 may be formed in the mesa etching region, and thus, sidewalls of the through holes 33h1 and 33h2 may have a stepped structure. In contrast, since the first LED stack 23 does not include the mesa etching region, the through holes 23h1, 23h2, 23h3, and 23h4 may have uniformly inclined sidewalls without having stepped sidewalls. In an exemplary embodiment, the second LED stack 33 may have the first conductivity type semiconductor layer 33a having a textured surface.

In the illustrated exemplary embodiment, the first LED stack 23, the second LED stack 33, and the third LED stack 43 may be stacked to overlap one another, and may also have substantially the same luminous area. However, the luminous area of the first LED stack 23 may be less than that of the second LED stack 33, and the luminous area of the second LED stack 33 may be less than that of the third LED stack 43, by the through holes 23h1, 23h2, 23h3, and 23h4 and the through holes 33h1 and 33h2. In addition, a side surface of the light emitting device 100 may be inclined, such that a width of the light emitting device 100 increases from the first LED stack 23 to the third LED stack 43, and, accordingly, the luminous area of the third LED stack 43 may be greater than that of the first LED stack 23. An inclination angle of the side surface of the light emitting device 100 with respect to the upper surface of the third LED stack 43 may be about 75 degrees to about 90 degrees. When the inclination angle is less than 75 degrees, the luminous area of the first LED stack 23 may become too small, and thus, it may be difficult to reduce a size of the light emitting device 100.

The first transparent electrode 25 is disposed between the first LED stack 23 and the second LED stack 33. The first transparent electrode 25 is in ohmic contact with the second conductivity type semiconductor layer 23b of the first LED stack 23, and transmits light generated by the first LED stack 23. The first transparent electrode 25 may be formed using a transparent oxide layer or a metal layer, such as indium tin oxide (ITO). The first transparent electrode 25 may cover an entire surface of the second conductivity type semiconductor layer 23b of the first LED stack 23, and a side surface thereof may be disposed in parallel with a side surface of the first LED stack 23. That is, the side surface of the first transparent electrode 25 may not be covered with the second bonding layer 59. Furthermore, the through holes 23h2, 23h3, and 23h4 may pass through the first transparent electrode 25, and thus, the first transparent electrode 25 may be exposed to sidewalls of the through holes. Meanwhile, the through hole 23h1 exposes an upper surface of the first transparent electrode 25. However, the inventive concepts are not limited thereto, and in some exemplary embodiments, the first transparent electrode 25 may be partially removed along an edge of the first LED stack 23, and thus, the side surface of the first transparent electrode 25 may be covered with the second bonding layer 59. In addition, in other exemplary embodiments, the first transparent electrode 25 may be previously patterned and removed in a region where the through holes 23h2, 23h3, and 23h4 are formed, and thus, the first transparent electrode 25 may not be exposed to the sidewalls of the through holes 23h2, 23h3, and 23h4.

A second transparent electrode 35 is in ohmic contact with the second conductivity type semiconductor layer 33b of the second LED stack 33. As shown, the second transparent electrode 35 contacts the upper surface of the second LED stack 33 between the first LED stack 23 and the second LED stack 33. The second transparent electrode 35 may be formed of a metal layer, or a conductive oxide layer that is transparent to red light, such as $SnO_2$, $InO_2$, ITO, ZnO, IZO, or the like. In particular, the second transparent electrode 35 may be formed of ZnO, which may be formed as a single crystal on the second LED stack 33. ZnO has favorable electrical and optical characteristics as compared with the metal layer or other conductive oxide layers. In particular, ZnO has a strong bonding force to the second LED stack 33, and thus, may be retained undamaged even when the growth substrate is separated therefrom using a laser lift-off or the like.

The second transparent electrode 35 may be partially removed along an edge of the second LED stack 33, and, accordingly, an outer side surface of the second transparent electrode 35 is not exposed to the outside, but covered with the lower insulation layer 51. In particular, the side surface of the second transparent electrode 35 is recessed inwardly than that of the second LED stack 33, and a region where the second transparent electrode 35 is recessed is filled with the lower insulation layer 51 and the second bonding layer 59. The second transparent electrode 35 is also recessed near the mesa etching region of the second LED stack 33, and the recessed region is filled with the lower insulation layer 51 and the second bonding layer 59.

The third transparent electrode 45 is in ohmic contact with the second conductivity type semiconductor layer 43b of the third LED stack 43. The third transparent electrode 45 may be disposed between the second LED stack 33 and the third LED stack 43, and contacts the upper surface of the third LED stack 43. The third transparent electrode 45 may be formed of a metal layer, or a conductive oxide layer that is transparent to red light and green light, such as $SnO_2$, $InO_2$, ITO, ZnO, IZO, or the like. In particular, the third transparent electrode 45 may be formed of ZnO, which may be formed as a single crystal on the third LED stack 43. ZnO has favorable electrical and optical characteristics as compared with the metal layer or other conductive oxide layers. In particular, ZnO has a strong bonding force to the third LED stack 43, and thus, may be retained undamaged even when the growth substrate is separated therefrom using the laser lift-off or the like.

The third transparent electrode 45 may be partially removed along an edge of the third LED stack 43, and, accordingly, an outer side surface of the third transparent electrode 45 is not exposed to the outside, but covered with the first bonding layer 49. In particular, the side surface of the third transparent electrode 45 is recessed inwardly than that of the third LED stack 43, and a region where the third transparent electrode 45 is recessed is filled with the first bonding layer 49. Meanwhile, the third transparent electrode 45 is also recessed near the mesa etching region of the third LED stack 43, and the recessed region is filled with the first bonding layer 49.

The second transparent electrode 35 and the third transparent electrode 45 are set to be recessed as described above, and thus, the side surfaces thereof may be prevented from being exposed to an etching gas, thereby improving the production yield of the light emitting device 100.

According to an exemplary embodiment, the second transparent electrode 35 and the third transparent electrode 45 may be formed of substantially the same conductive oxide layer, for example, ZnO, and the first transparent electrode 25 may be formed of a different conductive oxide layer than the second and third transparent electrodes 35 and 45, such as ITO. However, the inventive concepts are not limited thereto, and in some exemplary embodiments, each of the first to third transparent electrodes 25, 35, and 45 may include the same kind, or at least one may include a different kind of conductive oxide layer.

The n-electrode pad 47a is in ohmic contact with the first conductivity type semiconductor layer 43a of the third LED stack 43. The n-electrode pad 47a may be disposed on the first conductivity type semiconductor layer 43a exposed through the second conductivity type semiconductor layer 43b, that is, in the mesa etching region. The n-electrode pad 47a may be formed of, for example, Cr/Au/Ti. An upper surface of the n-electrode pad 47a may be disposed higher than that of the second conductivity type semiconductor layer 43b, and further, higher than that of the third transparent electrode 45. For example, a thickness of the n-electrode pad 47a may be about 2 μm or more. The n-electrode pad 47a may be in a shape of a truncated cone, but is not limited thereto. In other exemplary embodiments, the n-electrode pad 47a may have various shapes, such as a square pyramid, a cylindrical shape, or a cylindrical shape.

The lower p-electrode pad 47b may be formed of substantially the same material as the n-electrode pad 47a, and an upper surface of the lower p-electrode pad 47b is located at substantially the same elevation as the n-electrode pad 47a. Accordingly, a thickness of the lower p-electrode pad 47b may be less than that of the n-electrode pad 47a. In particular, the thickness of the lower p-electrode pad 47b may be approximately equal to a thickness of a portion of the n-electrode pad 47a protruding above the third transparent electrode 45. For example, the thickness of the lower p-electrode pad 47b may be about 1.2 μm or less. The upper surface of the lower p-electrode pad 47b is located at substantially the same elevation as that of the n-electrode pad 47a, and thus, the lower p-electrode pad 47b and the n-electrode pad 47a may be simultaneously exposed when the through holes 33h1 and 33h2 are formed. When the elevations of the n-electrode pad 47a and the lower p-electrode pad 47b are different, any one of the electrode pads may be damaged during the etching process. As such, the elevations of the n-electrode pad 47a and the lower p-electrode pad 47b may be set to be approximately equal, in order to prevent any one of the electrode pads from being damaged.

The first bonding layer 49 couples the second LED stack 33 to the third LED stack 43. More particularly, the first bonding layer 49 may be disposed between the first conductivity type semiconductor layer 33a and the third transparent electrode 45. The first bonding layer 49 may partially contact the second conductivity type semiconductor layer 43b, and may partially contact the first conductivity type semiconductor layer 43a exposed in the mesa etching region. In addition, the first bonding layer 49 may cover the n-electrode pad 47a and the lower p-electrode pad 47b.

The first bonding layer 49 may be formed of a transparent organic material layer, or may be formed of a transparent inorganic material layer. The organic material layer include, for example, SUB, poly methylmethacrylate (PMMA), polyimide, parylene, benzocyclobutene (BCB), or the like. The inorganic material layer include, for example, $Al_2O_3$, $SiO_2$, SiNx, or the like. In addition, the first bonding layer 49 may be formed of spin-on-glass (SOG).

The through hole 33h1 and the through hole 33h2 pass through the second LED stack 33 and the first bonding layer 49 to expose the n-electrode pad 47a and the lower p-electrode pad 47b, respectively. As described above, the through holes 33h1 and 33h2 may be formed in the mesa etching region, and thus, the through holes 33h1 and 33h2 may have stepped sidewalls.

The lower insulation layer 51 is formed on the second LED stack 33, and covers the second transparent electrode 35. The lower insulation layer 51 also covers the sidewalls of the through holes 33h1 and 33h2. The lower insulation layer 51 may have openings 51a exposing the n-electrode pad 47a, the lower p-electrode pad 47b, the first conductivity type semiconductor layer 33a, and the second transparent electrode 35. The lower insulation layer 51 may be formed of a silicon oxide film or a silicon nitride film, and may be formed to have a thickness of, for example, about 800 nm.

The lower common connector 53c may be disposed on the lower insulation layer 51, and connected to the first conductivity type semiconductor layer 33a and the n-electrode pad 47a exposed through the openings 51a of the lower insulation layer 51. The lower common connector 53c is connected to the first conductivity type semiconductor layer 33a in the mesa etching region of the second LED stack 33, and is connected to the n-electrode pad 47a through the through hole 33h1.

The lower p-connector 53b may be disposed on the lower insulation layer 51, and connected to the lower p-electrode pad 47b exposed through the opening 51a of the lower insulation layer 51. At least a portion of the lower p-connector 53b is disposed on the lower insulation layer 51.

The upper p-electrode pad 53g may be disposed on the second transparent electrode 35 in the opening 51a of the lower insulation layer 51. As shown in FIG. 3A and FIG. 3B, the upper p-electrode pad 53g may be disposed in the opening 51a while having a narrower width than that of the opening 51a. However, the inventive concepts are not limited thereto, and in some exemplary embodiments, the width of the upper p-electrode pad 53g may be greater than that of the opening 51a, and a portion of the upper p-electrode pad 53g may be disposed on the lower insulation layer 51.

The lower common connector 53c, the lower p-connector 53b, and the upper p-electrode pad 53g may be formed together in the same process with the same material. These may be formed of, for example, Ni/Au/Ti, and may be formed to have a thickness of about 2 μm.

The second bonding layer 59 couples the first LED stack 23 to the second LED stack 33. As shown, the second bonding layer 59 may be disposed between the first transparent electrode 25 and the lower insulation layer 51. The second bonding layer 59 may also cover the lower common connector 53*c*, the lower p-connector 53*b*, and the upper p-electrode pad 53*g*. The second bonding layer 59 may also partially contact the second transparent electrode 35 exposed through the opening 51*a* of the lower insulation layer 51. The second bonding layer 59 may be formed of substantially the same material as the first bonding layer 49 described above.

The through holes 23*h*1, 23*h*2, 23*h*3, and 23*h*4 pass through the first LED stack 23. The through hole 23*h*1 is formed to provide a passage for allowing electrical connection to the first transparent electrode 25. In the illustrated exemplary embodiment, the through hole 23*h*1 exposes the upper surface of the first transparent electrode 25, and does not pass through the first transparent electrode 25. However, the inventive concepts are not limited thereto. For example, in some exemplary embodiments, the through hole 23*h*1 may pass through the first transparent electrode 25 as long as the through hole 23*h*1 provides a passage for electrical connection to the first transparent electrode 25.

The through holes 23*h*2, 23*h*3, and 23*h*4 may pass through the first LED stack 23, and may also pass through the second bonding layer 59. The through hole 23*h*2 exposes the upper p-electrode pad 53*g*, the through hole 23*h*3 exposes the lower p-connector 53*b*, and the through hole 23*h*4 exposes the lower common connector 53*c*.

The through holes 23*h*1, 23*h*2, 23*h*3, and 23*h*4 may be formed by etching the first conductivity type semiconductor layer 23*a* and the second conductivity type semiconductor layer 23*b* in the same process, and thus, the sidewalls of the through holes 23*h*1, 23*h*2, 23*h*3, and 23*h*4 may have evenly inclined surfaces without having a stepped structure.

The intermediate insulation layer 61 covers the first LED stack 23, and covers the sidewalls of the through holes 23*h*1, 23*h*2, 23*h*3, and 23*h*4. The intermediate insulation layer 61 may also cover side surfaces of the first to third LED stacks 23, 33, and 43. Moreover, the intermediate insulation layer 61 may cover the substrate 41 exposed near the side surfaces of the first to third LED stacks 22, 33, and 43. The intermediate insulation layer 61 may be patterned to have openings 61*a* exposing a bottom portion of each of the through holes 23*h*1, 23*h*2, 23*h*3, and 23*h*4. The first transparent electrode 25, the upper p-electrode pad 53*g*, the lower p-connector 53*b*, and the lower common connector 53*c* may be exposed in the through holes 23*h*1, 23*h*2, 23*h*3, and 23*h*4 by the openings 61*a*. Further, the intermediate insulation layer 61 may have an opening 61*b* exposing the upper surface of the first LED stack 23, that is, the first conductivity type semiconductor layer 23*a*. The intermediate insulation layer 61 may be formed of an aluminum oxide film, a silicon oxide film, or a silicon nitride film, and may be formed to have a thickness of, for example, about 800 nm.

The first upper connector 63*r*, the second upper connector 63*g*, the third upper connector 63*b*, and the upper common connector 63*c* are disposed on the intermediate insulation layer 61. Each of these upper connectors 63*r*, 63*g*, 63*b*, and 63*c* is connected to the first transparent electrode 25, the upper p-electrode pad 53*g*, and the lower p-connector 53*b* exposed through the openings 61*a* of the intermediate insulation layer 61, respectively. Furthermore, the upper common connector 63*c* may be connected to the first conductivity type semiconductor layer 23*a* exposed in the opening 61*b*.

The first upper connector 63*r*, the second upper connector 63*g*, the third upper connector 63*b*, and the upper common connector 63*c* may be formed of substantially the same material, for example, AuGe/Ni/Au/Ti, in the same process. AuGe may be in ohmic contact with the first conductivity type semiconductor layer 23*a*. AuGe may be formed to have a thickness of about 100 nm, and Ni/Au/Ti may be formed to have a thickness of about 2 um. In some exemplary embodiments, AuTe may be used instead of AuGe.

The upper insulation layer 71 covers the intermediate insulation layer 61, and covers the first upper connector 63*r*, the second upper connector 63*g*, the third upper connector 63*b*, and the upper common connector 63*c*. The upper insulation layer 71 may also cover the intermediate insulation layer 61 on the side surfaces of the first to third LED stacks 23, 33, and 43. The upper insulation layer 71 may have openings 71*a* exposing the first upper connector 63*r*, the second upper connector 63*g*, the third upper connector 63*b*, and the upper common connector 63*c*. The openings 71*a* of the upper insulation layer 71 may be generally disposed on flat surfaces of the first upper connector 63*r*, the second upper connector 63*g*, the third upper connector 63*b*, and the upper common connector 63*c*. The upper insulation layer 71 may be formed of a silicon oxide film or a silicon nitride film, and may be formed thinner than the intermediate insulation layer 61, for example, to about 400 nm thick.

Each of the bump pads 73*r*, 73*g*, 73*b*, and 73*c* may be disposed on the first upper connector 63*r*, the second upper connector 63*g*, and the third upper connector 63*b*, and the common connector 63*c* in the openings 71*a* of the upper insulation layer 71 and electrically connected thereto.

The first bump pad 73*r* may be electrically connected to the second conductivity type semiconductor layer 23*b* of the first LED stack 23 through the first upper connector 63*r* and the first transparent electrode 25.

The second bump pad 73*g* may be electrically connected to the second conductivity type semiconductor layer 33*b* of the second LED stack 33 through the second upper connector 63*g*, the upper p-electrode pad 53*g*, and the second transparent electrode 35.

The third bump pad 73*b* may be electrically connected to the second conductivity type semiconductor layer 43*b* of the third LED stack 43 through the third upper connector 63*b*, the lower p-connector 53*b*, the lower p-electrode pad 47*b*, and the third transparent electrode 45.

The common bump pad 73*c* may be electrically connected to the first conductivity type semiconductor layer 23*a* of the first LED stack 23 through the upper common connector 63*c*, electrically connected to the first conductivity type semiconductor layer 33*a* of the second LED stack 33 through the lower common connector 53*c*, and electrically connected to the first conductivity type semiconductor layer 43*a* of the third LED stack 43 through the n-electrode pad 47*a*.

That is, each of the first to third bump pads 73*r*, 73*g*, and 73*b* may be electrically connected to the second conductivity type semiconductor layers 23*b*, 33*b*, and 43*b* of the first to third LED stacks 23, 33, and 43, and the common bump pad 73*c* may be commonly electrically connected to the first conductivity type semiconductor layers 23*a*, 33*a*, and 43*a* of the first to third LED stacks 23, 33, and 43.

The bump pads 73*r*, 73*g*, 73*b*, and 73*c* may be disposed in the openings 71*a* of the upper insulation layer 71, and upper surfaces of the bump pads may be substantially flat. The bump pads 73*r*, 73*g*, 73*b*, and 73*c* may be disposed on the flat surfaces of the first to third upper connectors 63*r*, 63*g* and 63*b* and the upper common connector 63*c*. The bump pads 73*r*, 73*g*, 73*b*, and 73*c* may be formed of Au/In. For example, Au may be formed to have a thickness of about 3 μm, and In may be formed to have a thickness of about 1 μm.

The light emitting device 100 may be bonded to the pads of the circuit board 101 using In, without being limited thereto. In some exemplary embodiment, the light emitting device 100 may be bonded to the circuit board 101 using Pb or AuSn.

In the illustrated exemplary embodiment, the upper surfaces of the bump pads 73r, 73g, 73b, and 73c are described and illustrated as being flat, but the inventive concepts are not limited thereto. For example, in some exemplary embodiments, the upper surfaces of the bump pads 73r, 73g, 73b, and 73c may be irregular, and some of the bump pads may be disposed on the upper insulation layer 71.

According to the illustrated exemplary embodiment, the first LED stack 23 is electrically connected to the bump pads 73r and 73c, the second LED stack 33 is electrically connected to the bump pads 73g and 73c, and the third LED stack 43 is electrically connected to the bump pads 73b and 73c. Accordingly, cathodes of the first LED stack 23, the second LED stack 33, and the third LED stack 43 are electrically connected to the common bump pad 73c, and anodes thereof are electrically connected to the first to third bump pads 73r, 73g, and 73b, respectively. Accordingly, the first to third LED stacks 23, 33, and 43 may be driven independently.

Figure 4A:
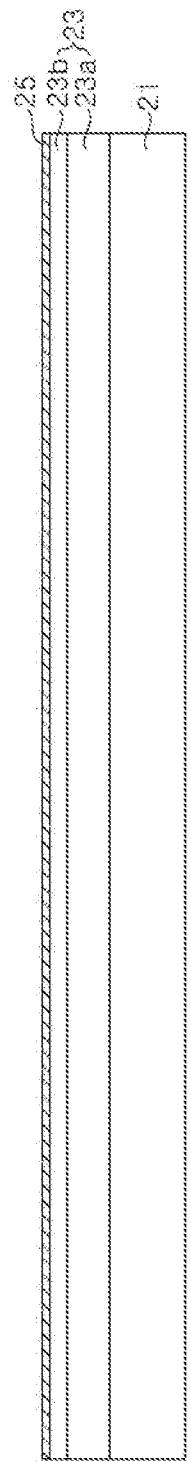
FIG. 4A, FIG. 4B, and FIG. 4C are schematic cross-sectional views illustrating first, second, and third LED stacks grown on growth substrates according to an exemplary embodiment.
Figure 4B:
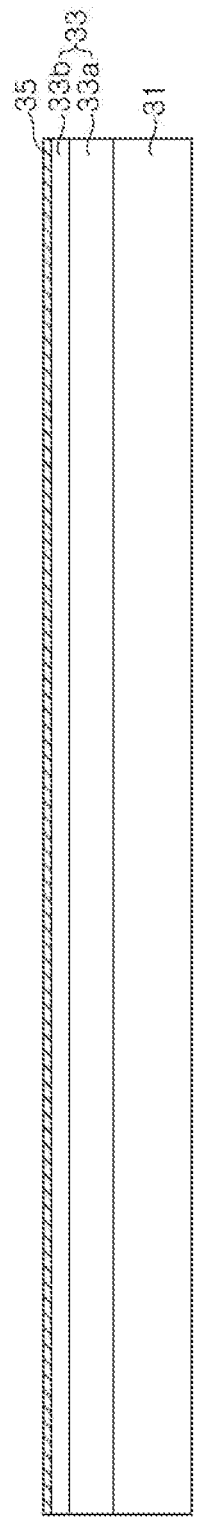
Figure 4C:
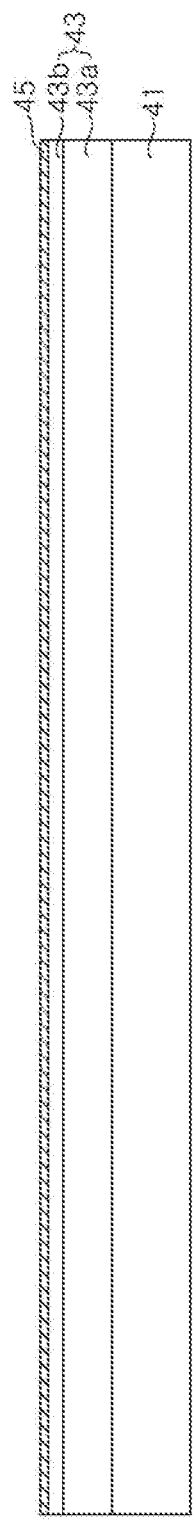

A structure of the light emitting device 100 will be described in more detail through a method of manufacturing the light emitting device 100 described below. FIG. 4A, FIG. 4B, and FIG. 4C are schematic cross-sectional views illustrating the first to third LED stacks grown on growth substrates according to an exemplary embodiment.

First, referring to FIG. 4A, a first LED stack 23 including a first conductivity type semiconductor layer 23a and a second conductivity type semiconductor layer 23b is grown on a first substrate 21. An active layer may be interposed between the first conductivity type semiconductor layer 23a and the second conductivity type semiconductor layer 23b.

The first substrate 21 may be a substrate capable of growing the first LED stack 23 thereon, such as a GaAs substrate. The first conductivity type semiconductor layer 23a and the second conductivity type semiconductor layer 23b may be formed of an AlGaInAs-based or AlGaInP-based semiconductor layer, and the active layer may include, for example, an AlGaInP-based well layer. A composition ratio of AlGaInP may be determined so that the first LED stack 23 emits red light, for example.

A first transparent electrode 25 may be formed on the second conductivity type semiconductor layer 23b. As described above, the first transparent electrode 25 may be formed of a metal layer or a conductive oxide layer that transmits light generated by the first LED stack 23, for example, red light. The first transparent electrode 25 may be formed of, for example, indium-tin oxide (ITO).

Referring to FIG. 4B, a second LED stack 33 including a first conductivity type semiconductor layer 33a and a second conductivity type semiconductor layer 33b is grown on a second substrate 31. An active layer may be interposed between the first conductivity type semiconductor layer 33a and the second conductivity type semiconductor layer 33b.

The second substrate 31 may be a substrate capable of growing the second LED stack 33 thereon, such as a sapphire substrate, a GaN substrate, or a GaAs substrate. The first conductivity type semiconductor layer 33a and the second conductivity type semiconductor layer 33b may be formed of an AlGaInAs-based or AlGaInP-based semiconductor layer, an AlGaInN-based semiconductor layer, and the active layer may include, for example, an AlGaInP-based well layer or AlGaInN-based well layer. A composition ratio of AlGaInP or AlGaInN may be determined so that the second LED stack 33 emits green light, for example.

A second transparent electrode 35 may be formed on the second conductivity type semiconductor layer 33b. As described above, the second transparent electrode 35 may be formed of a metal layer or a conductive oxide layer that transmits light generated by the second LED stack 33, for example, green light. In particular, the second transparent electrode 35 may be formed of ZnO.

Referring to FIG. 4C, a third LED stack 43 including a first conductivity type semiconductor layer 43a and a second conductivity type semiconductor layer 43b is grown on a third substrate 41. An active layer may be interposed between the first conductivity type semiconductor layer 43a and the second conductivity type semiconductor layer 43b.

The third substrate 41 may be a substrate capable of growing the third LED stack 43 thereon, such as a sapphire substrate, a SiC substrate, or a GaN substrate. In one exemplary embodiment, the third substrate 41 may be a flat sapphire substrate, but may also be a patterned sapphire substrate. The first conductivity type semiconductor layer 43a and the second conductivity type semiconductor layer 43b may be formed of an AlGaInN-based semiconductor layer, and the active layer may include, for example, an AlGaInN-based well layer. A composition ratio of AlGaInN may be determined so that the third LED stack 43 emits blue light, for example.

A third transparent electrode 45 may be formed on the second conductivity type semiconductor layer 43b. As described above, the third transparent electrode 45 may be formed of a metal layer or a conductive oxide layer that transmits light generated in the first and second LED stacks 23 and 33, for example, red light and green light. In particular, the third transparent electrode 45 may be formed of ZnO.

The first to third LED stacks 23, 33, and 43 are grown on the different growth substrates 21, 31, and 41, respectively, and, accordingly, the order of the manufacturing process is not limited.

Hereinafter, a method of manufacturing the light emitting device 100 using first to third LED stacks 23, 33, and 43 grown on growth substrates 21, 31, and 41 will be described. Hereinafter, although a region of a single light emitting device 100 will be exemplarily illustrated and described, a plurality of light emitting devices 100 may be manufactured in a batch in the same manufacturing process using the LED stacks 23, 33, and 43 grown on the growth substrates 21, 31, and 41.

FIGS. 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C and 13D are schematic plan views and cross-sectional views illustrating the method of manufacturing the light emitting device 100 for a display according to an exemplary embodiment. The cross-sectional views are shown to correspond to those of FIGS. 3B, 3C, and 3D.

Figure 5A:
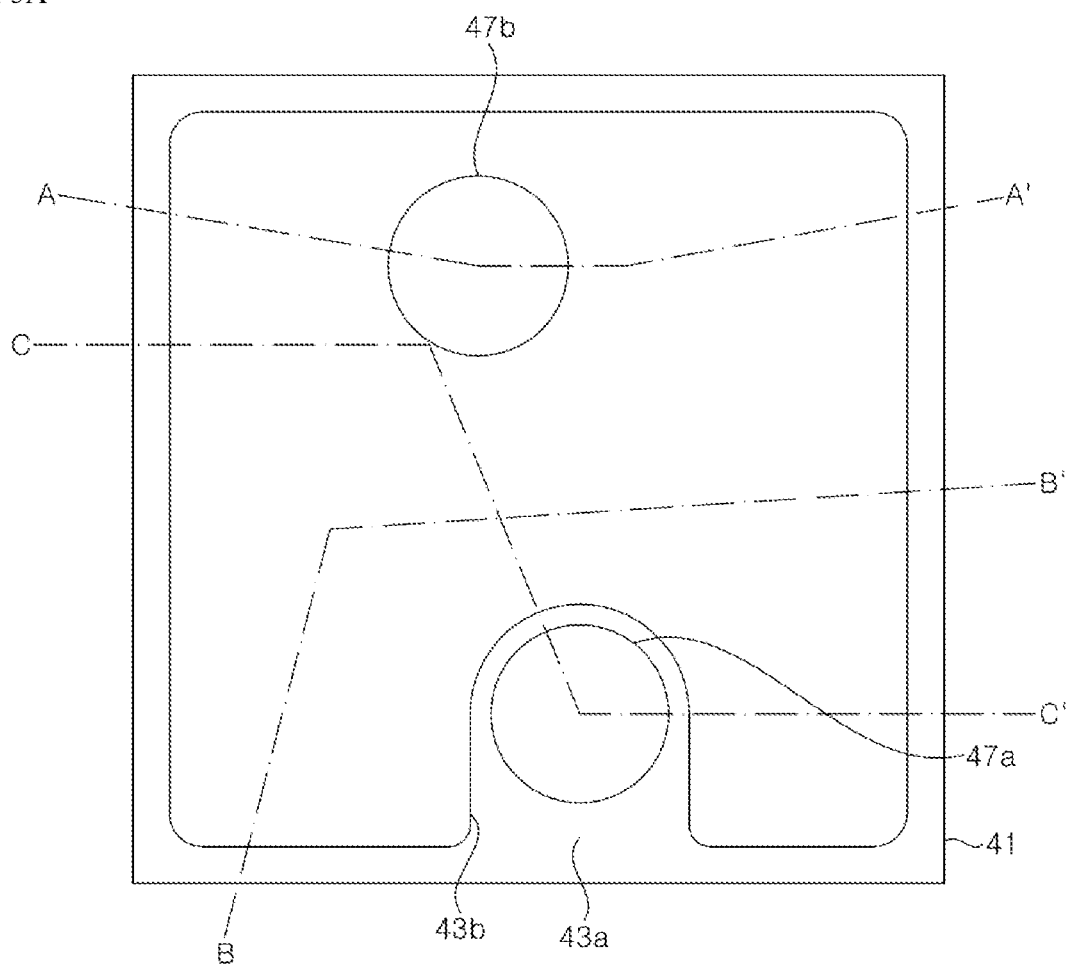
FIGS. 5A, 5B, 5C, 5D, 6A, 6B, 6C, 6D, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 13A, 13B, 13C and 13D are schematic plan views and cross-sectional views illustrating a method of manufacturing a light emitting device for a display according to an exemplary embodiment.

First, referring to FIG. 5A, FIG. 5B, FIG. 5C, and FIG. 5D, the third transparent electrode 45 and the second conductivity type semiconductor layer 43b are patterned to expose the first transparent semiconductor layer 43a using photo and etching techniques. This process corresponds to, for example, a mesa etching process. A photoresist pattern may be used as an etching mask. For example, after the etching mask is formed, the third transparent electrode 45 may be etched first by a wet etching technique, and then the second conductivity type semiconductor layer 43b may be etched by a dry etching technique using the same etching mask. Accordingly, the third transparent electrode 45 may be recessed from a mesa etching region. FIG. 5A exemplarily shows an edge of the mesa and does not show an edge of the third transparent electrode 45. However, since the third transparent electrode 45 is wet etched using the same etching mask, the edge of the third transparent electrode 45 is also recessed from the edge of the mesa toward an inner side of the mesa. Since the same etching mask is used, the number of photo processes is not increased, thereby reducing the process cost. However, the inventive concepts are not limited thereto, and the etching mask for etching the mesa etching process and a different etching mask for etching the third transparent electrode 45 may be used, respectively.

Subsequently, an n-electrode pad 47a and a lower p-electrode pad 47b are formed on the first conductivity type semiconductor layer 43a and the third transparent electrode 45, respectively. The n-electrode pad 47a and the lower p-electrode pad 47b may be formed to have different thicknesses. In particular, an upper surface of the n-electrode pad 47a and that of the lower p-electrode pad 47b may be located at substantially the same elevation.

Figure 5B:
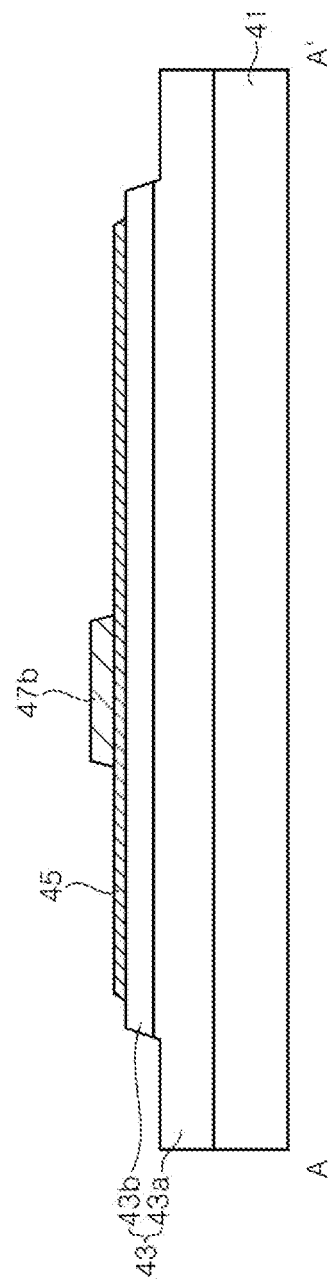
Figure 5C:
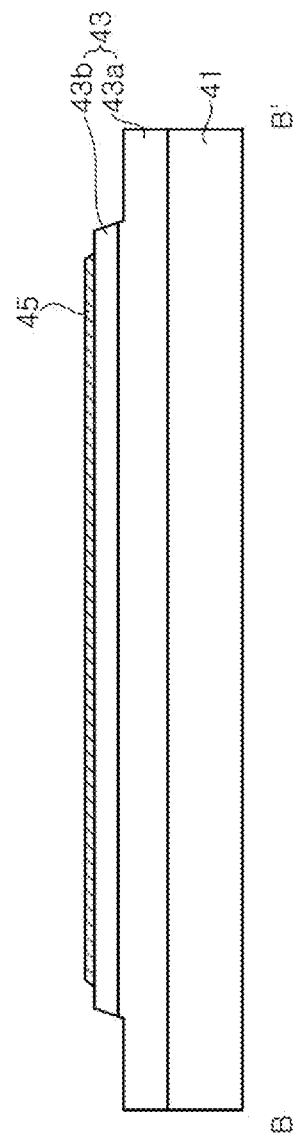
Figure 5D:
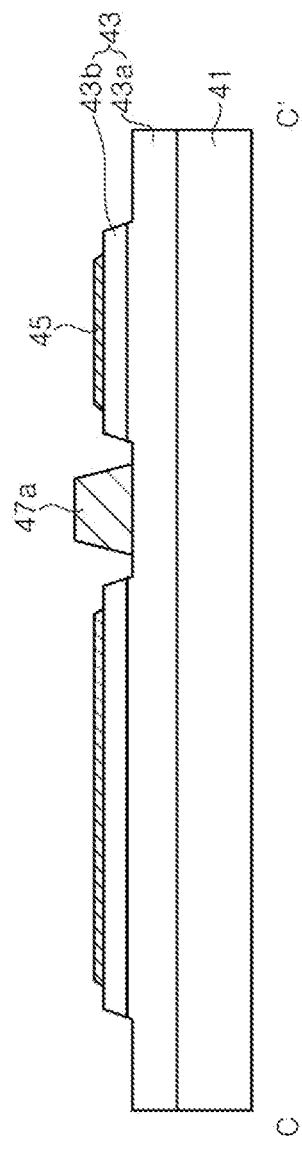

Referring to FIG. 6A, FIG. 6B, FIG. 6C, and FIG. 6D, the second LED stack 33 described with reference to FIG. 4B is bonded onto the third LED stack 43 described with reference to FIG. 5A and FIG. 5B. The second LED stack 33 is bonded to a temporary substrate using a temporary bonding/debonding (TBDB) technique, and the second substrate 31 is removed from the second LED stack 33. The second substrate 31 may be removed using, for example, a laser lift off technique. After the second substrate 31 is removed, a roughened surface may be formed on a surface of the first conductivity type semiconductor layer 33a. Thereafter, the first conductivity type semiconductor layer 33a of the second LED stack 33 bonded to the temporary substrate may be disposed to face the third LED stack 43, and bonded to the third LED stack 43. The second LED stack 33 and the third LED stack 43 are bonded to each other by a first bonding layer 49. After bonding the second LED stack 33, the temporary substrate may also be removed using the laser lift off technique, for example. Accordingly, the second LED stack 33 may be disposed on the third LED stack 43, and the second transparent electrode 35 is disposed on an upper surface thereof.

When the second transparent electrode 35 includes ITO, ITO may be peeled from the second LED stack 33 when the second substrate 31 is removed using the laser lift off technique. As such, when the second substrate 31 is removed using the laser lift-off technique, the second transparent electrode 35 may include ZnO having a favorable bonding force.

Subsequently, the second transparent electrode 35 and the second conductivity type semiconductor layer 33b are patterned to expose the first conductivity type semiconductor layer 33a. The second transparent electrode 35 and the second conductivity type semiconductor layer 33b may be patterned by using photo and etching techniques. This process may be performed using the wet etching and the dry etching techniques in substantially the same manner as the mesa etching process, in which the third transparent electrode 45 and the second conductivity type semiconductor layer 43b are etched as described above.

Figure 6A:
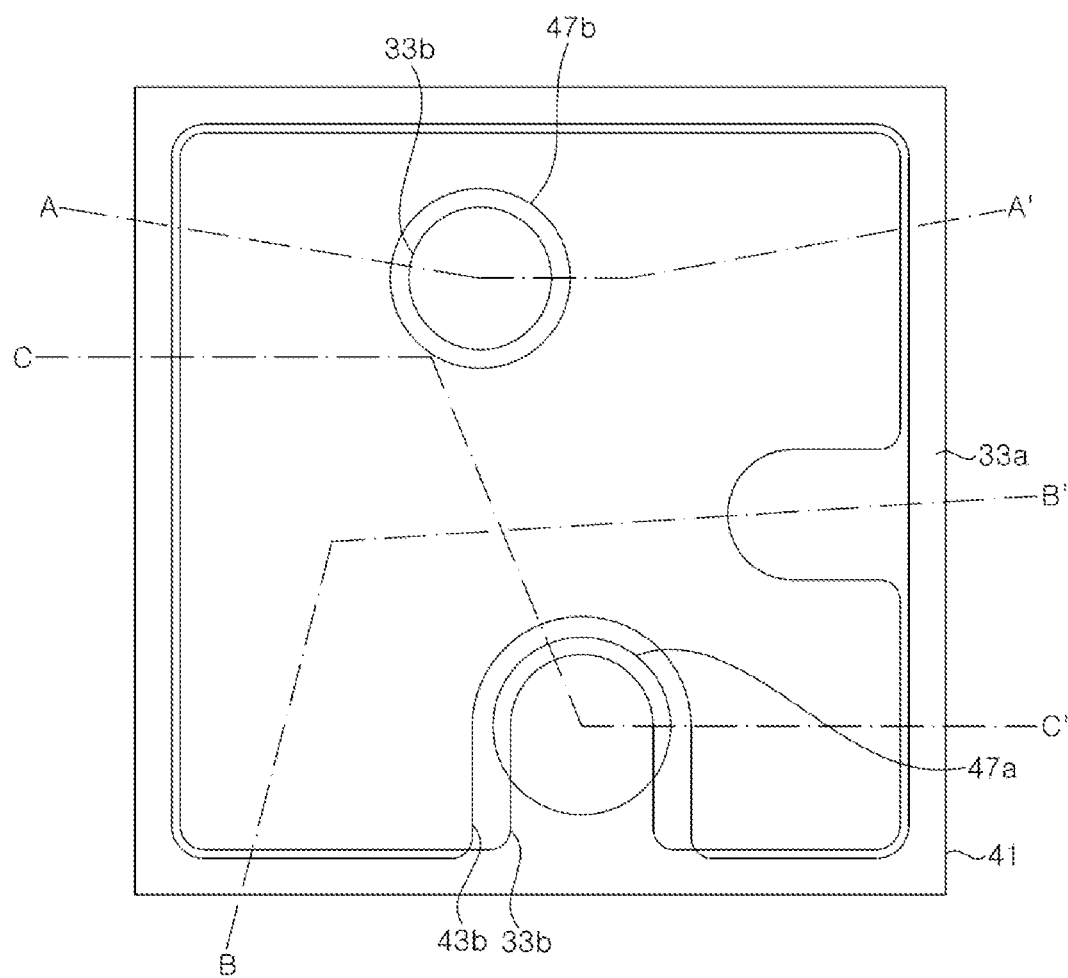
Figure 6B:
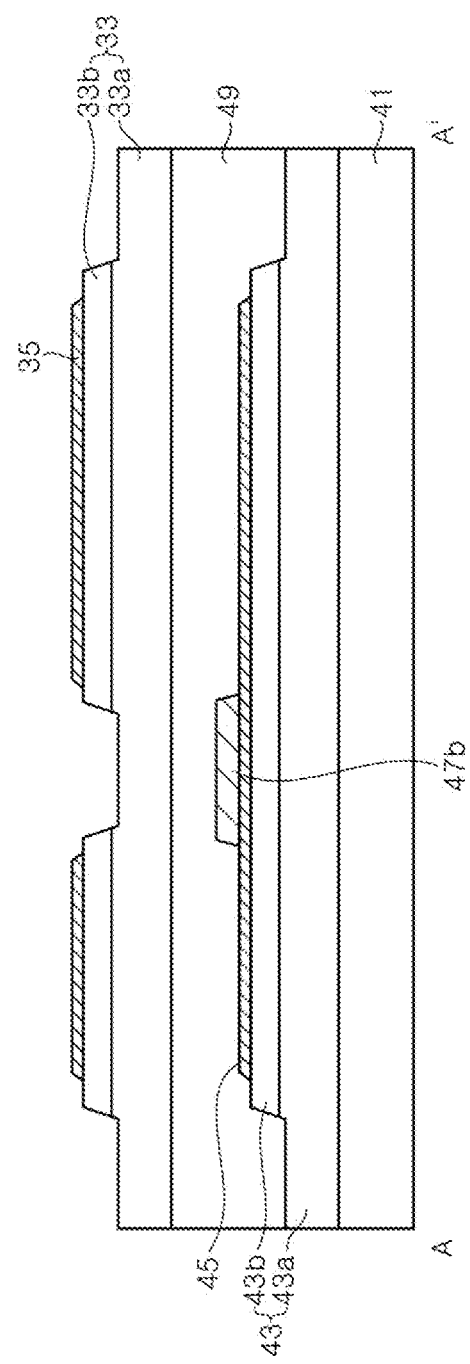
Figure 6C:
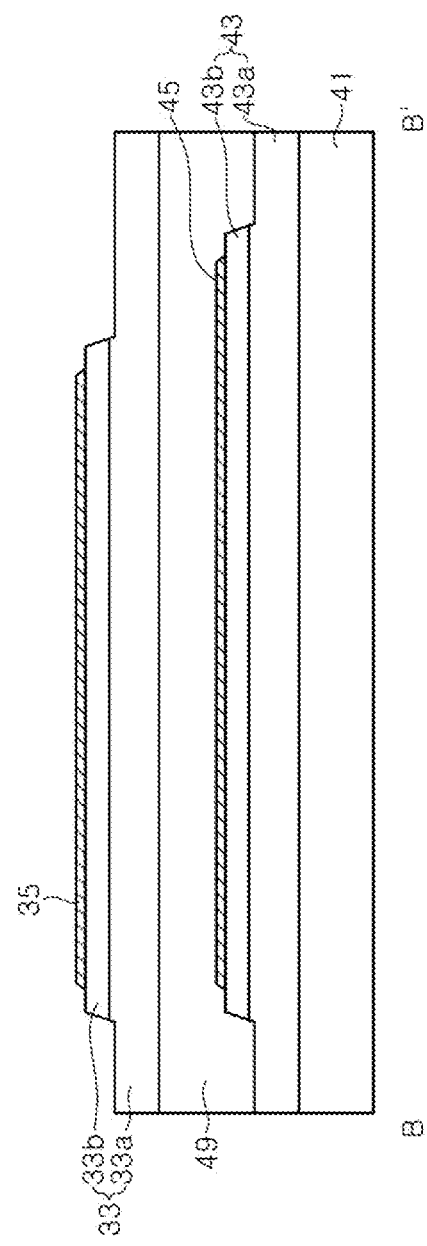
Figure 6D:
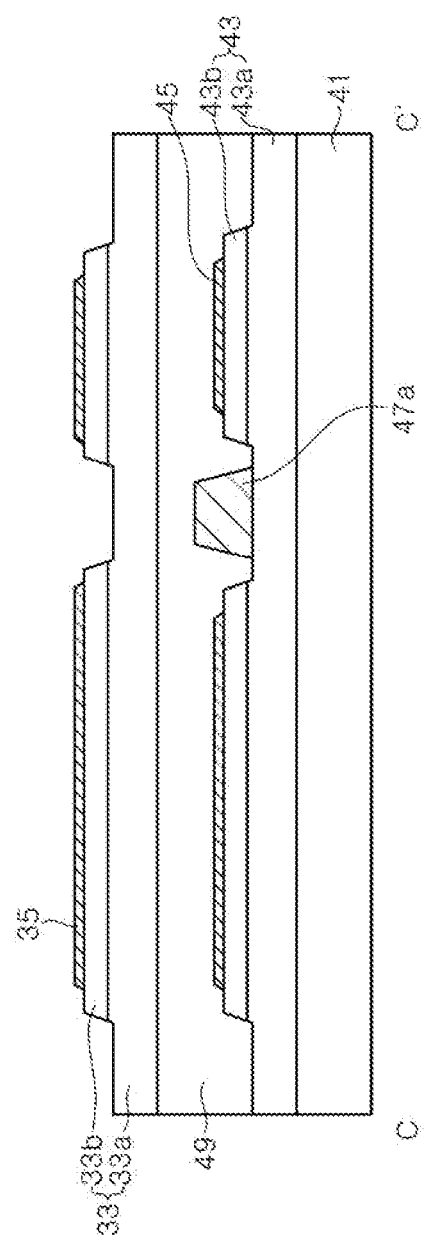
Figure 7A:
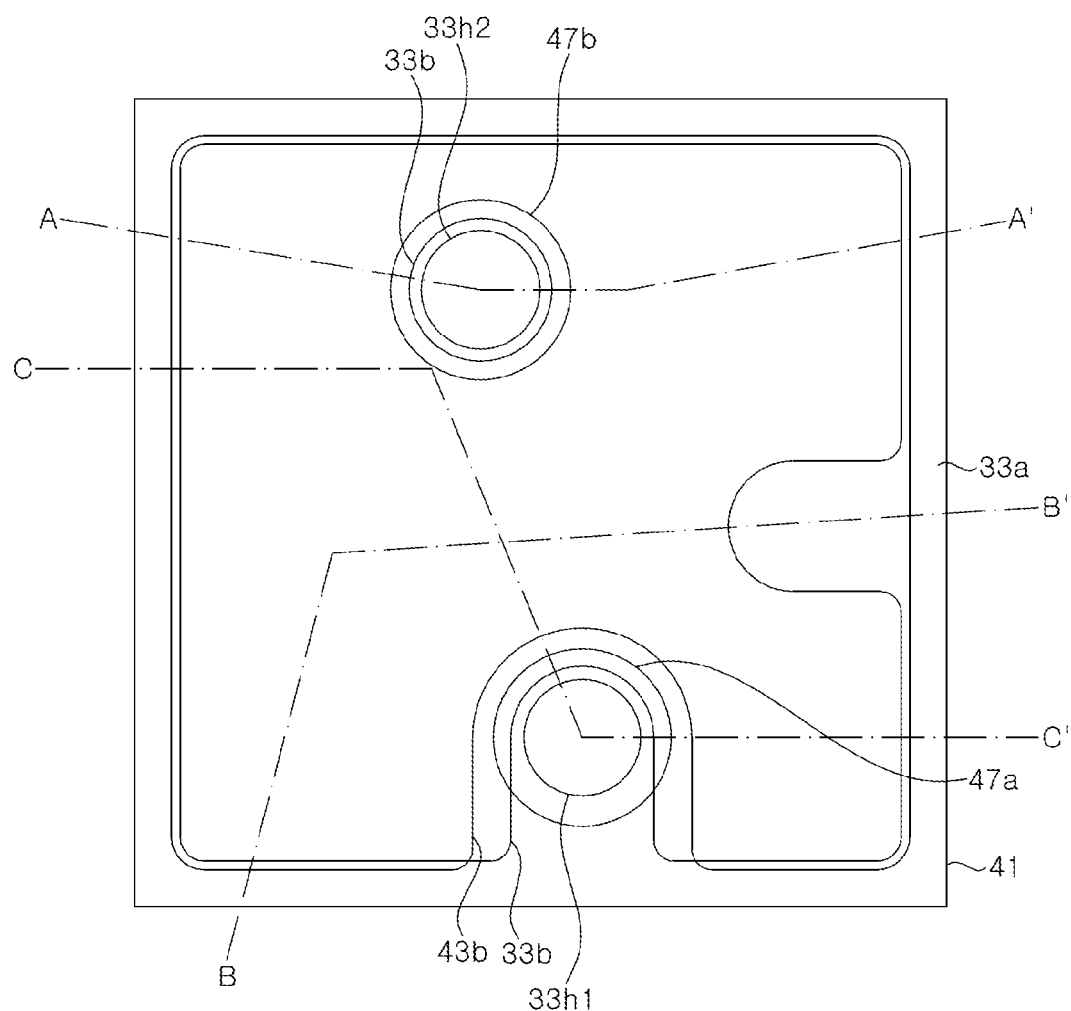
Figure 7B:
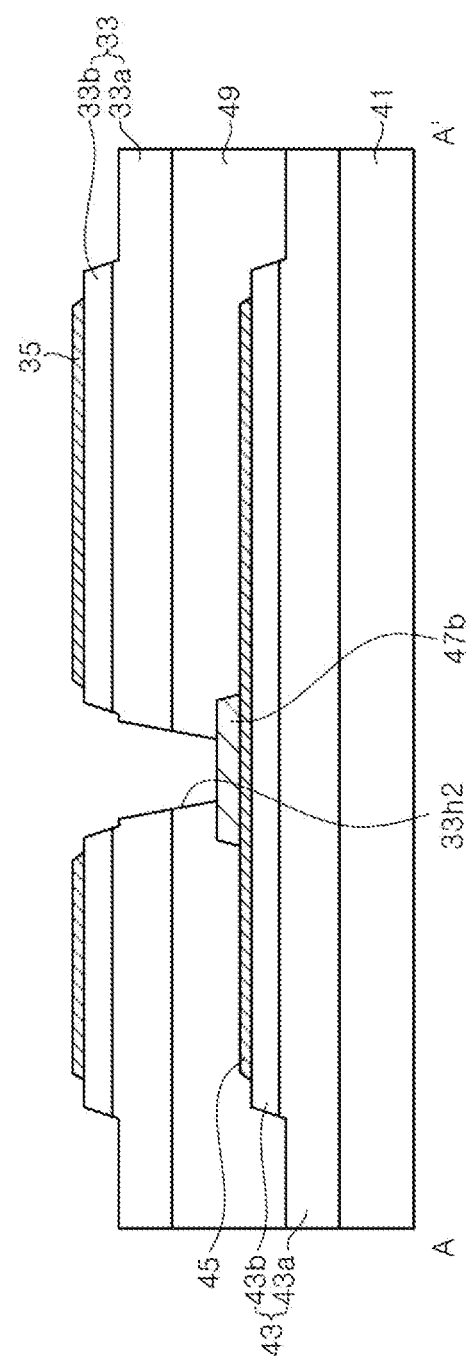
Figure 7C:
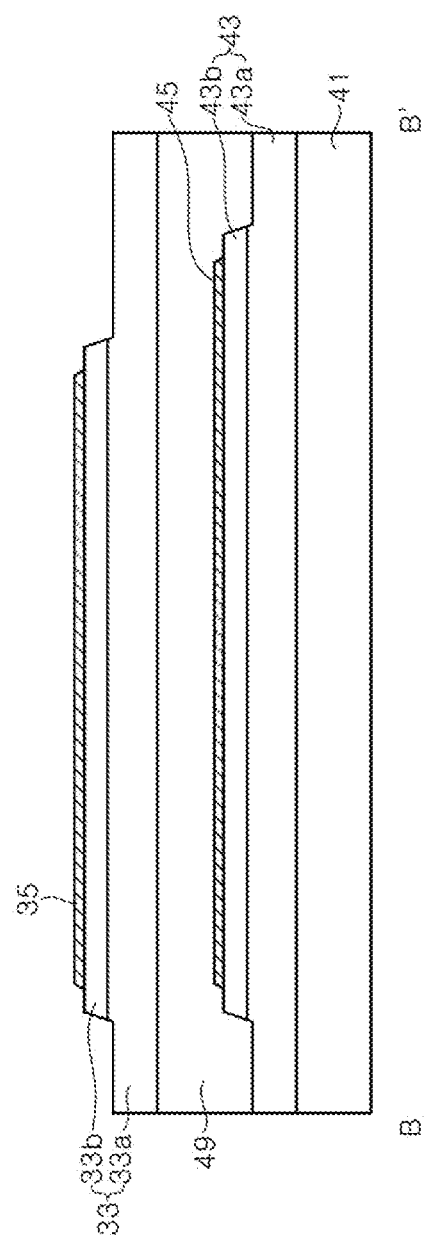
Figure 7D:
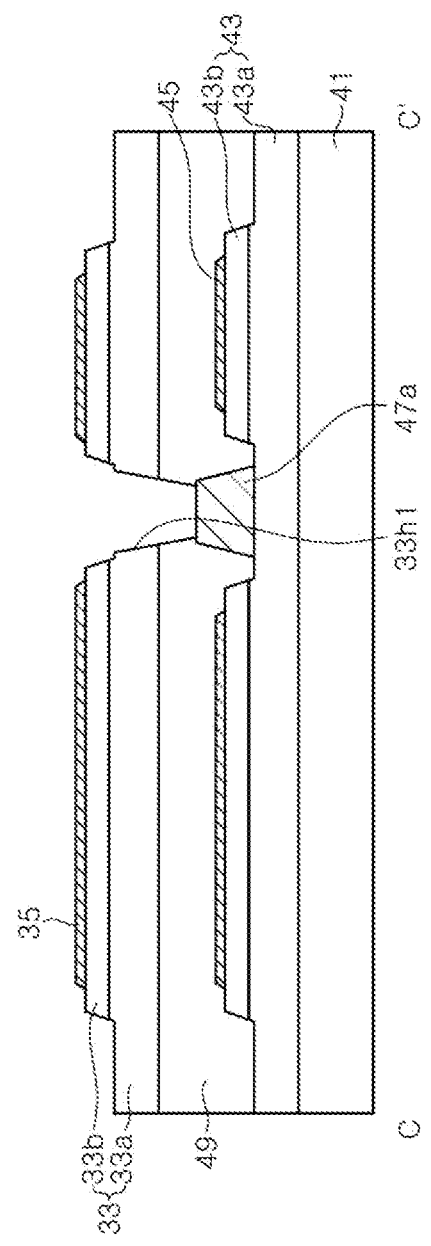
Figure 8A:
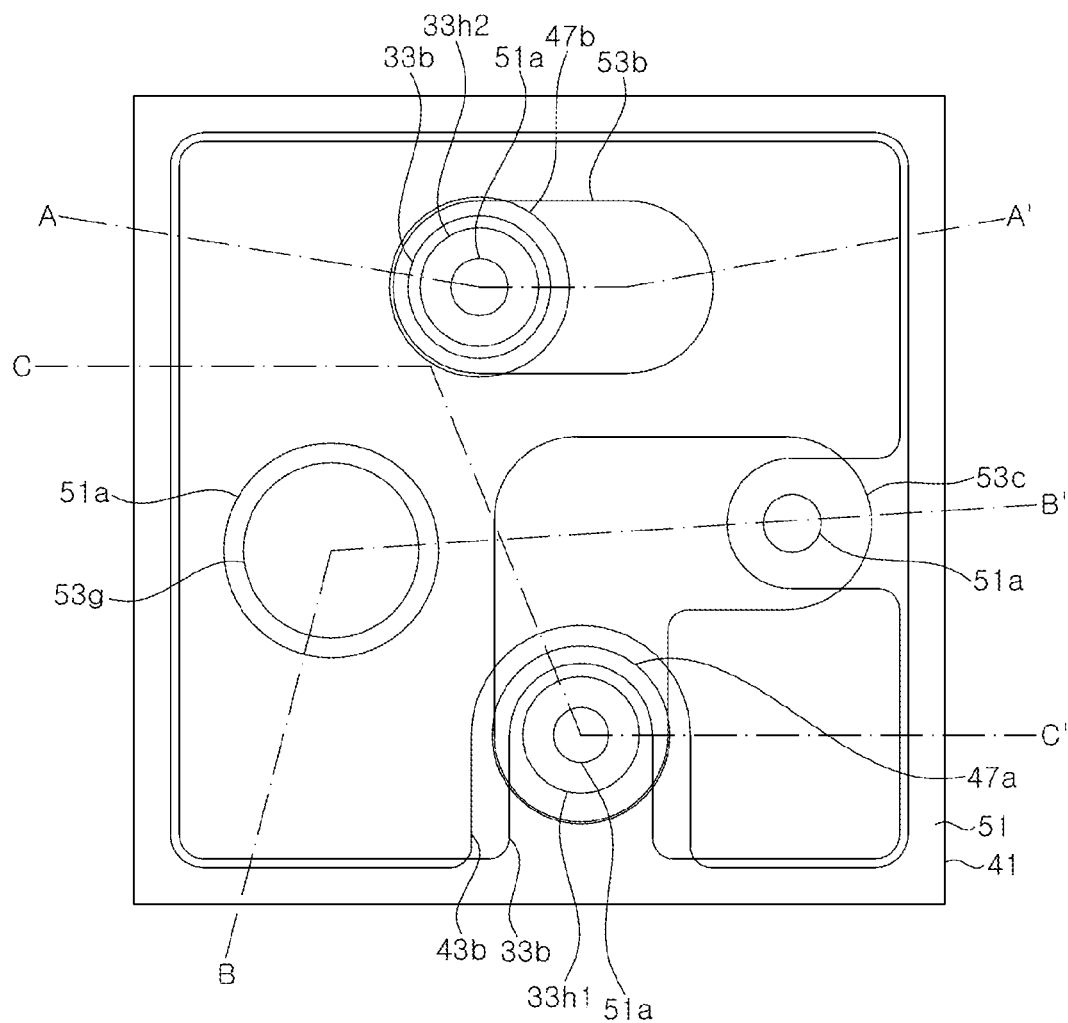
Figure 8B:
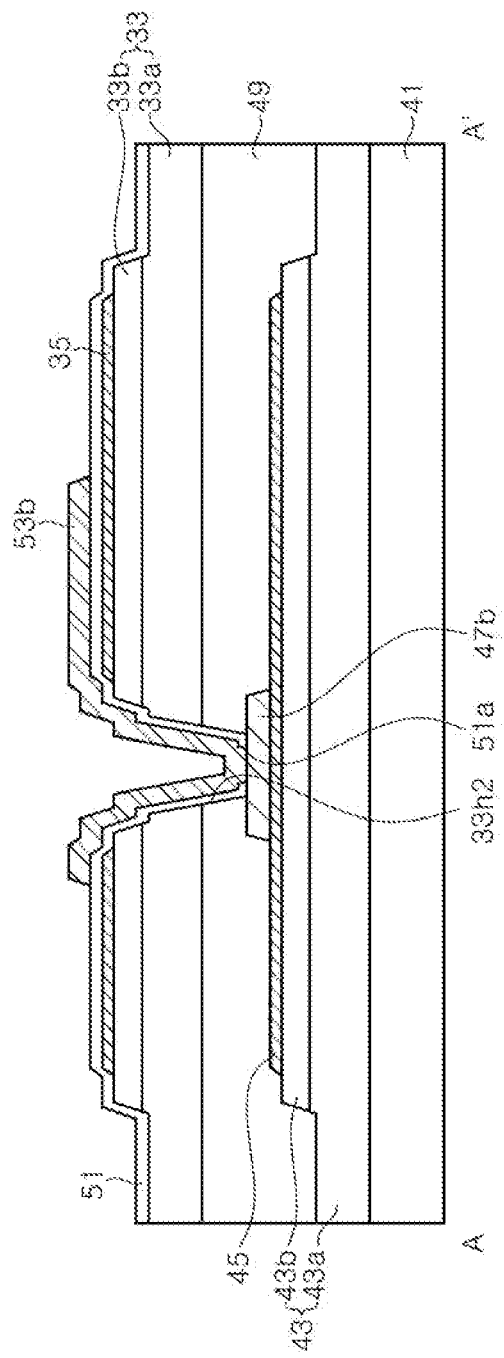
Figure 8C:
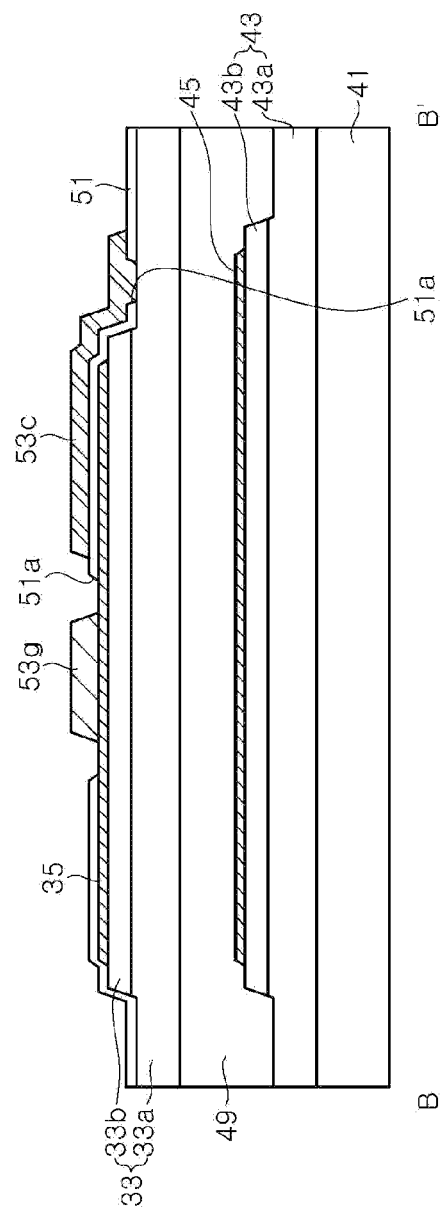
Figure 8D:
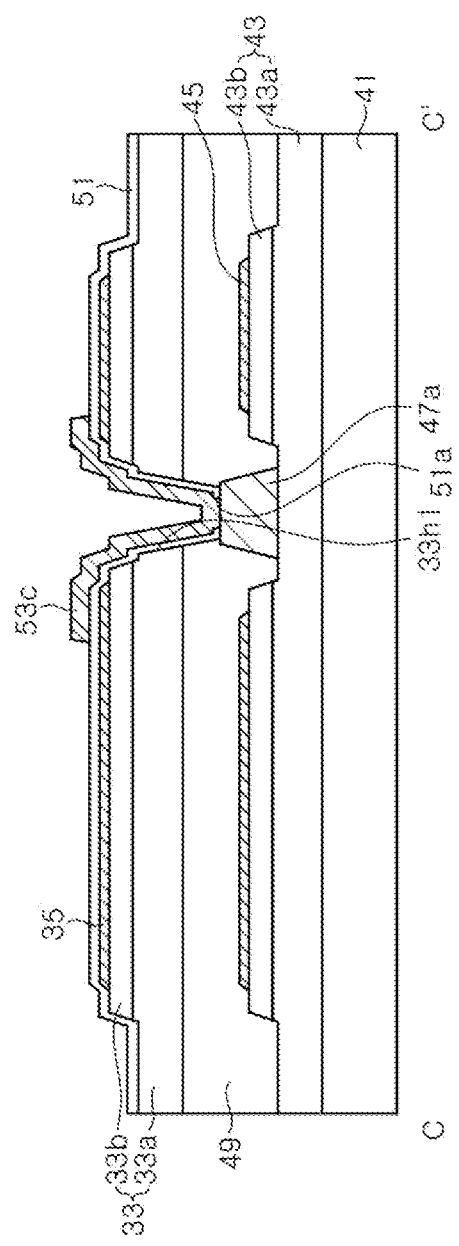
Figure 9A:
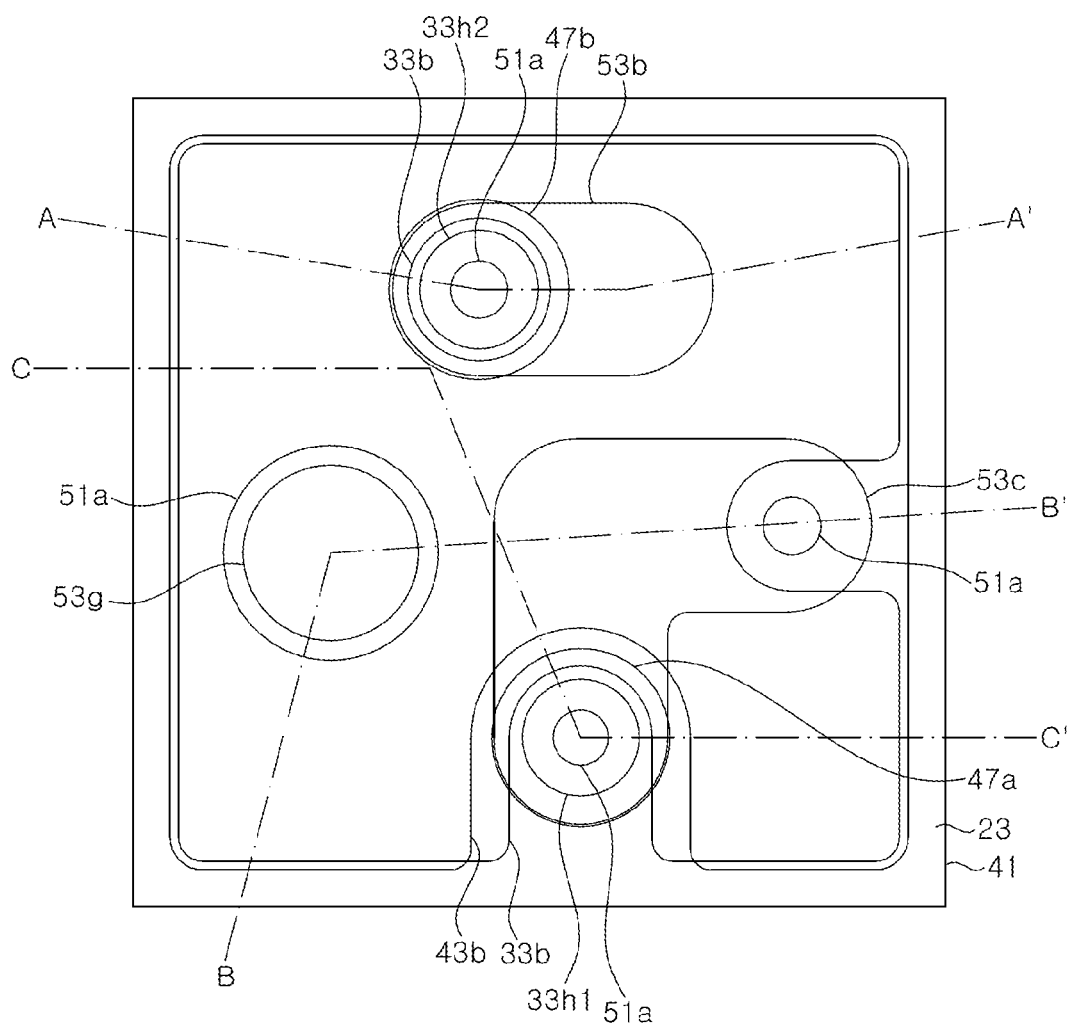
Figure 9B:
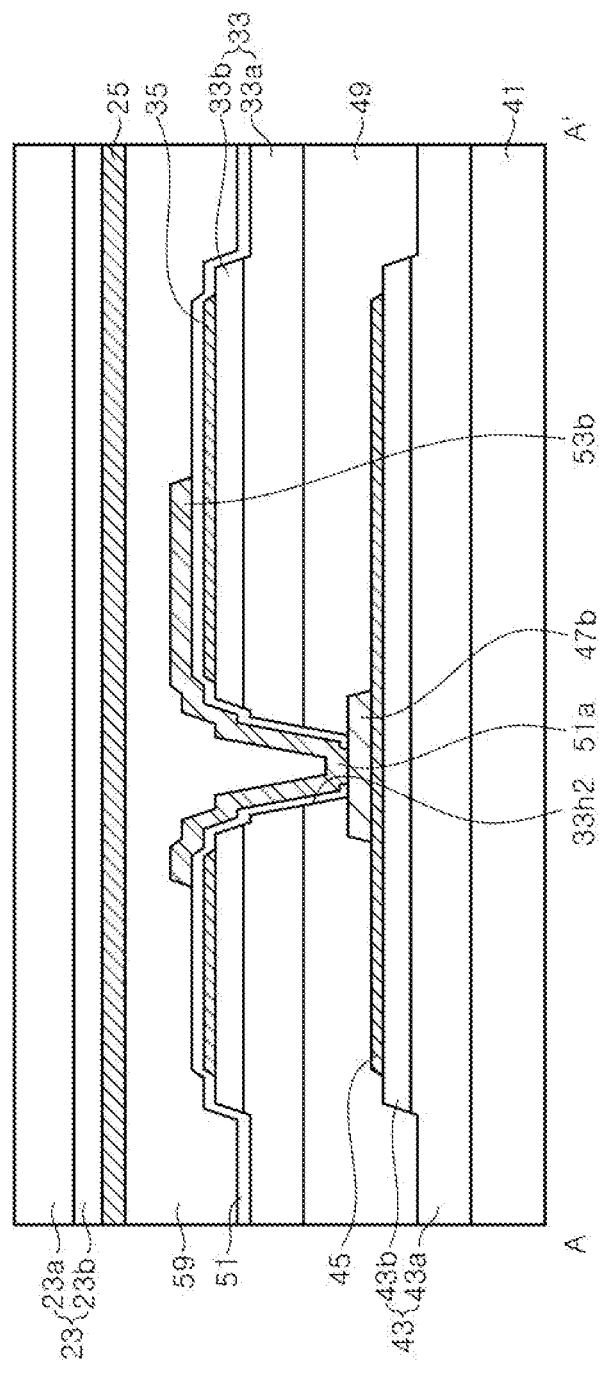
Figure 9C:
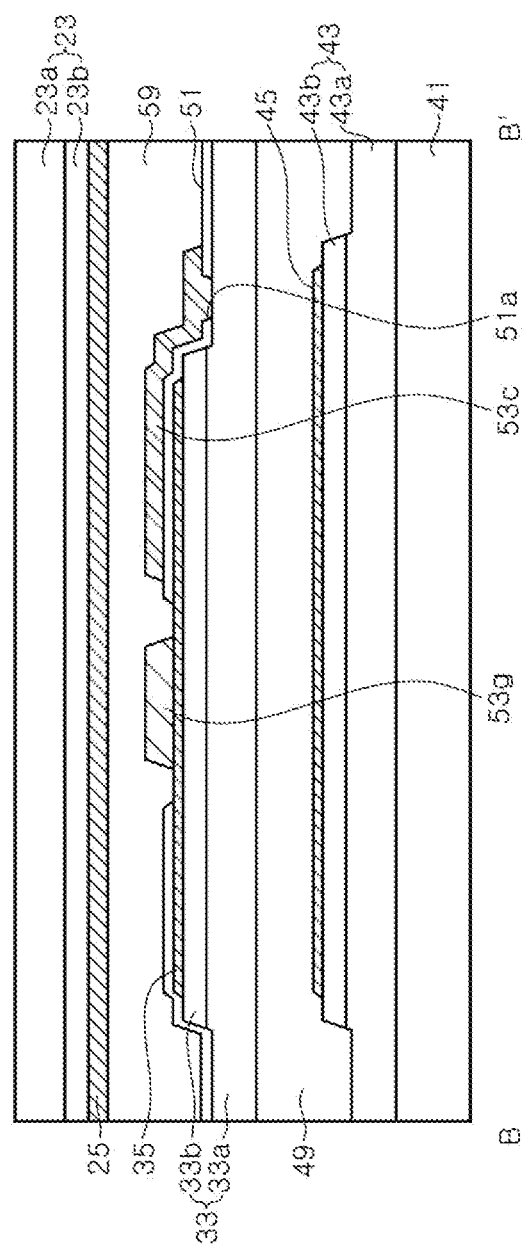
Figure 9D:
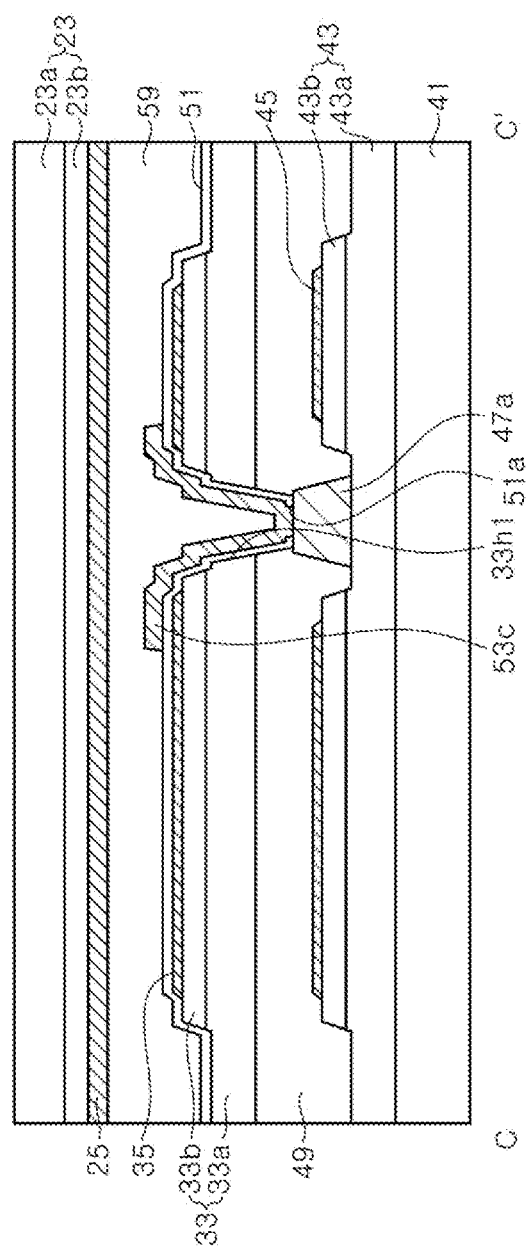
Figure 10A:
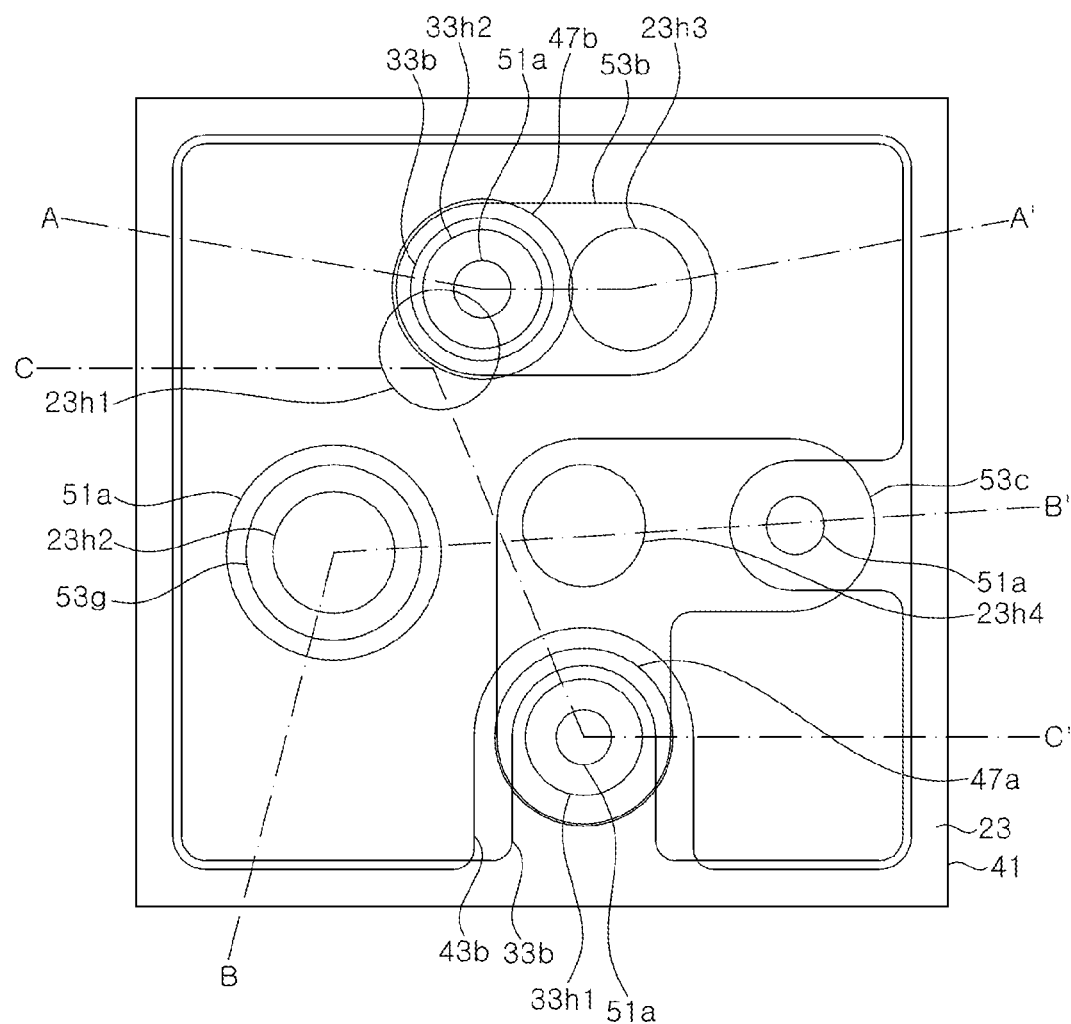
Figure 10B:
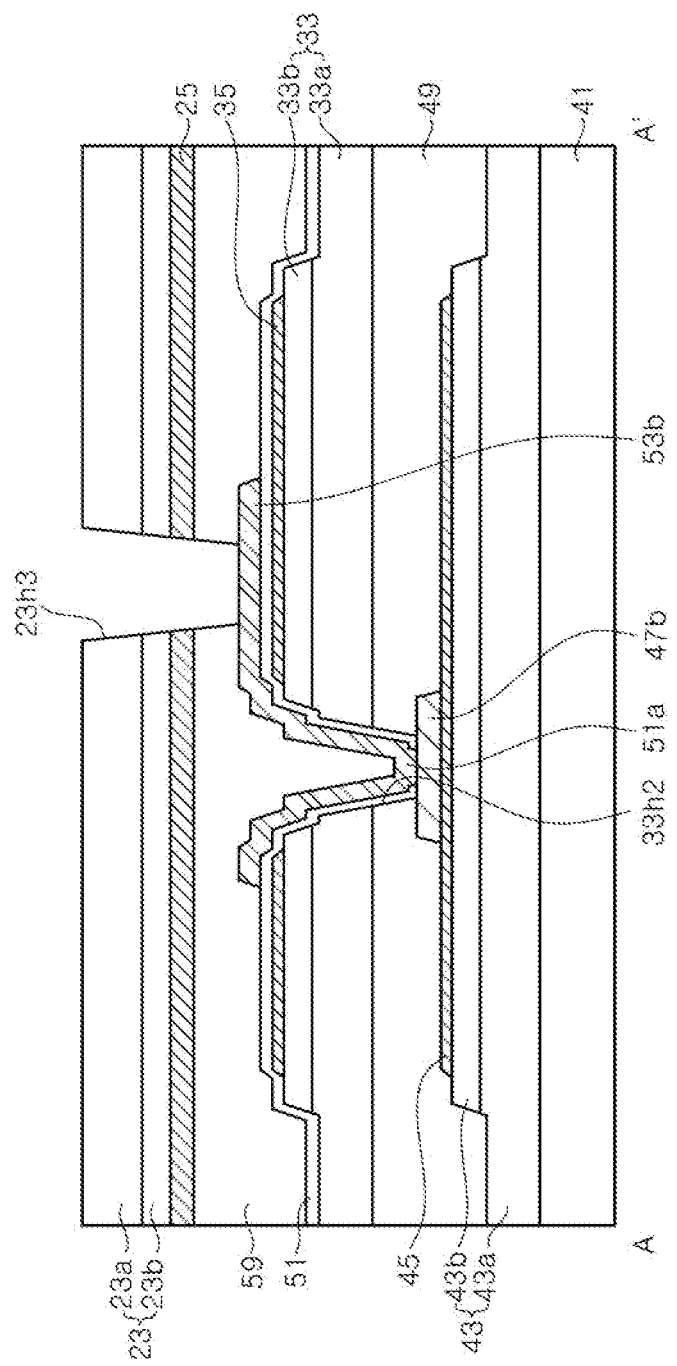
Figure 10C:
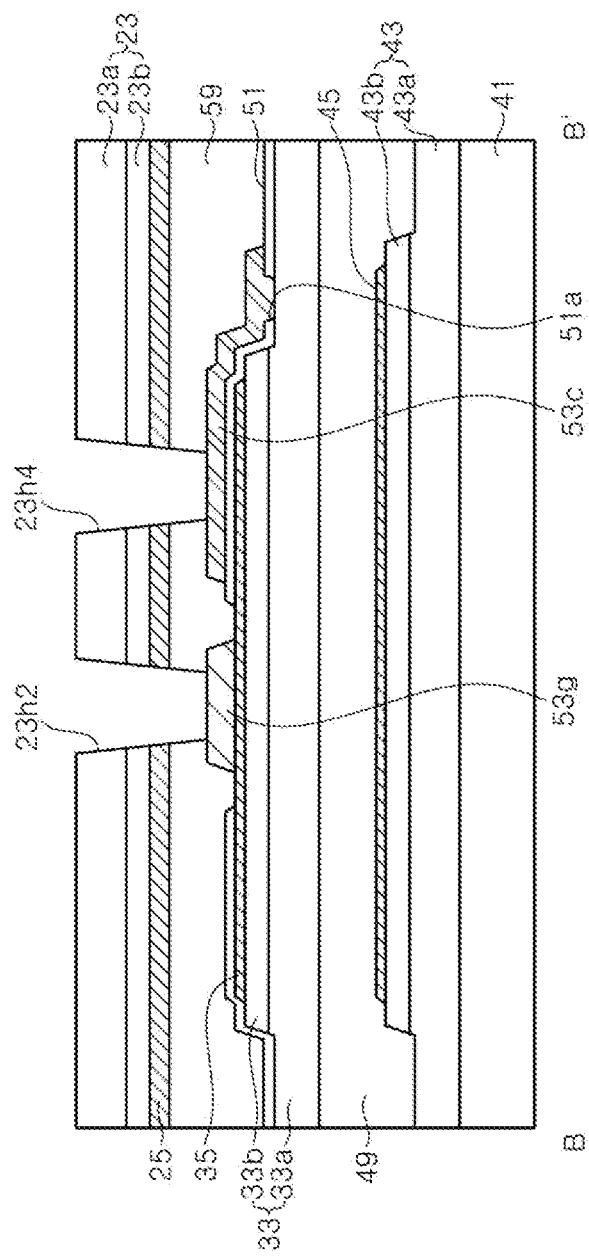
Figure 10D:
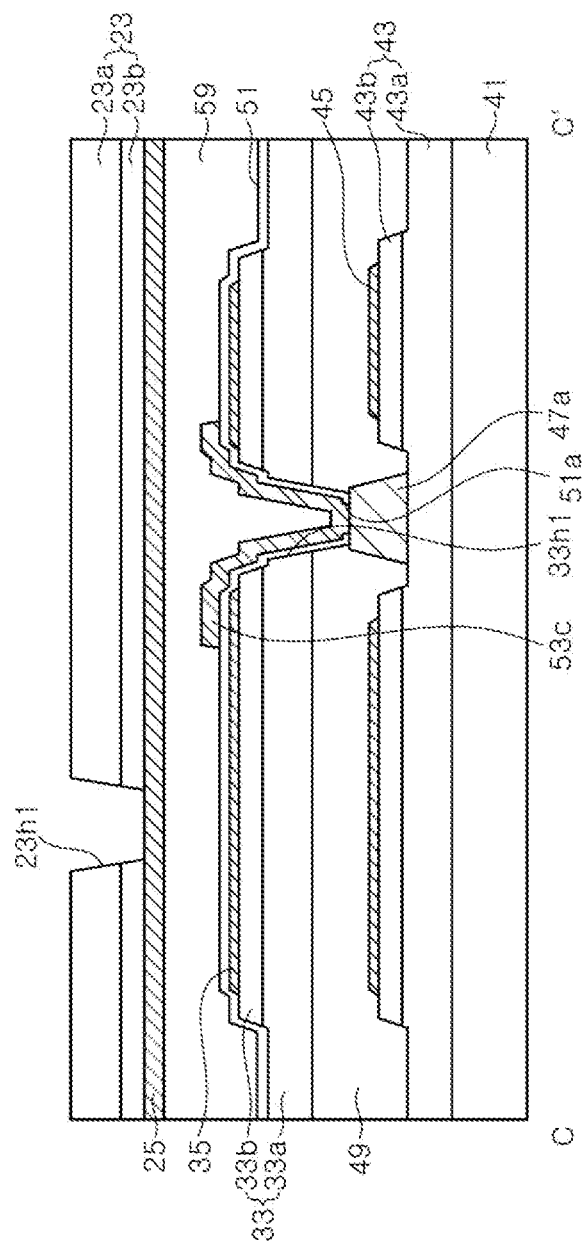
Figure 11A:
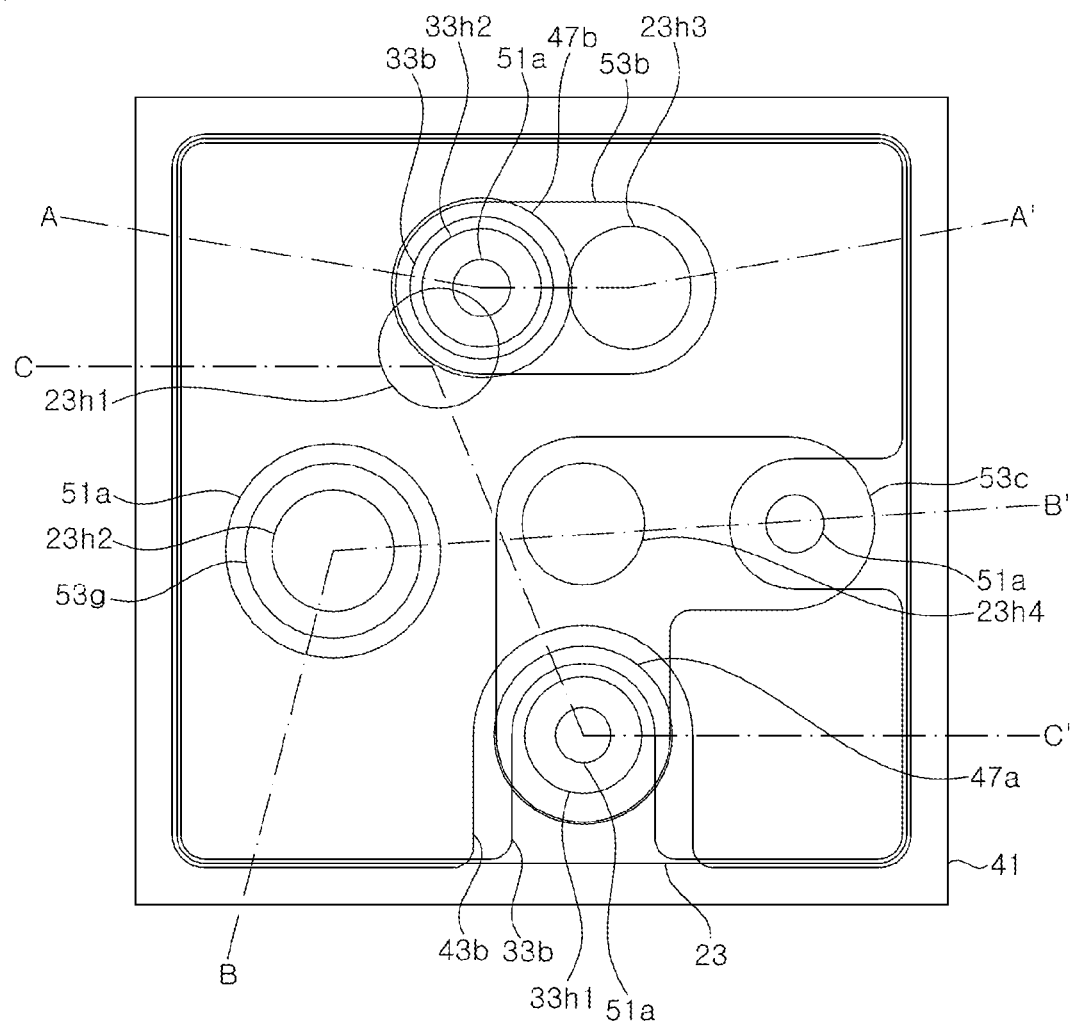
Figure 11B:
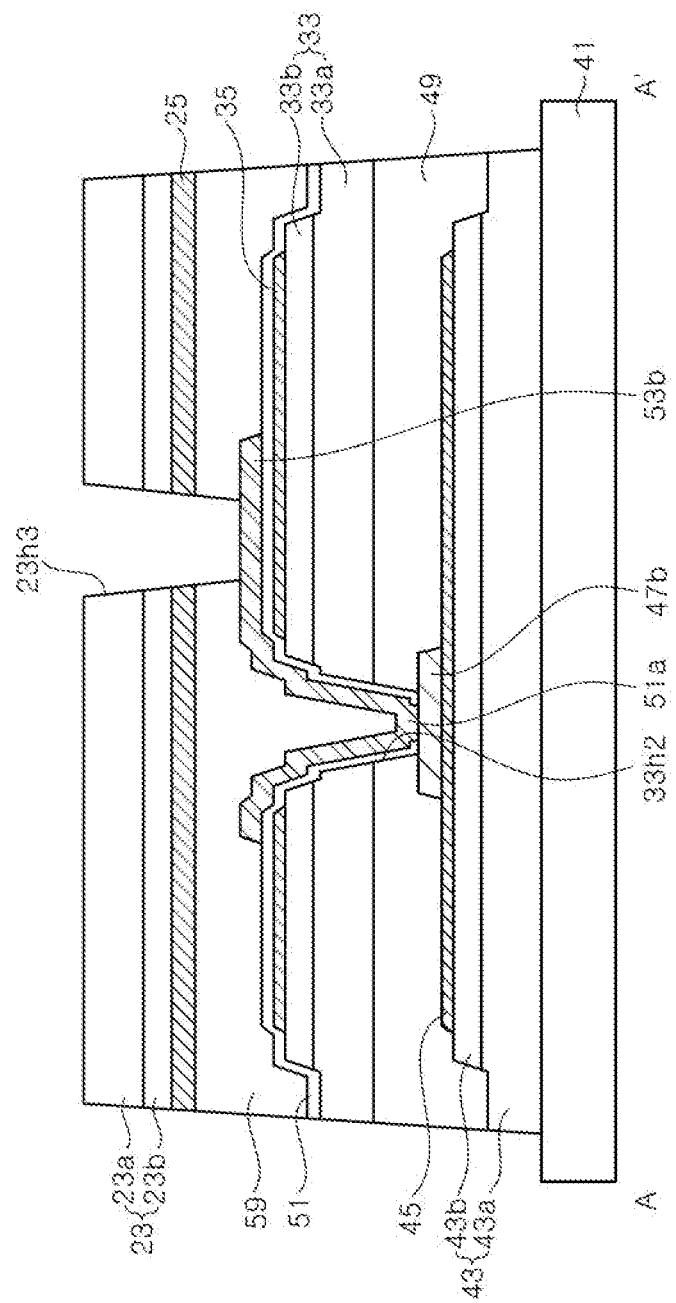
Figure 11C:
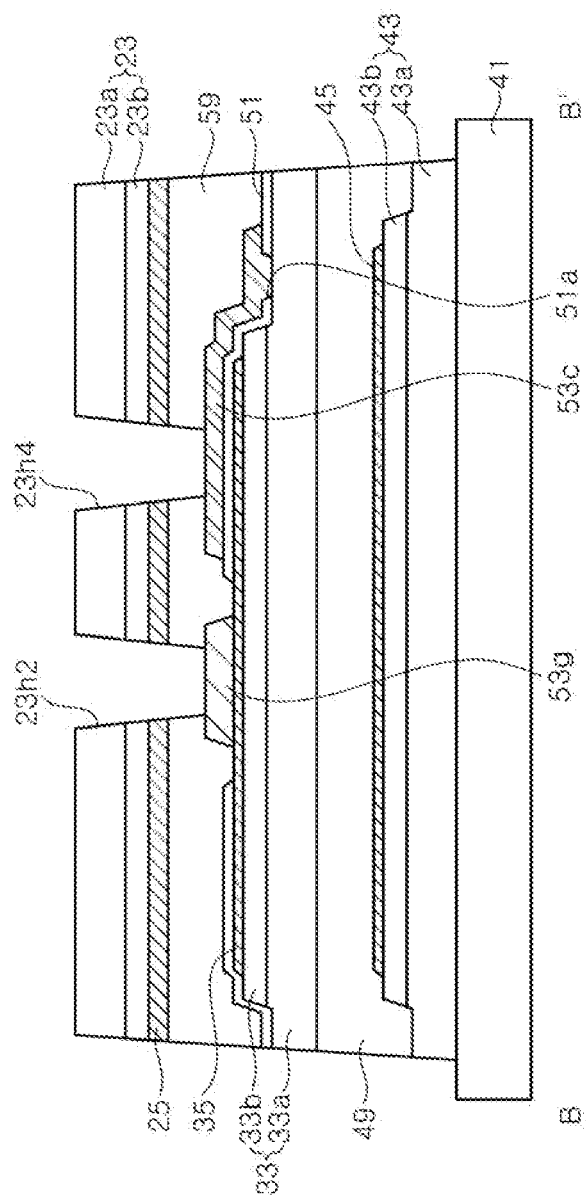
Figure 11D:
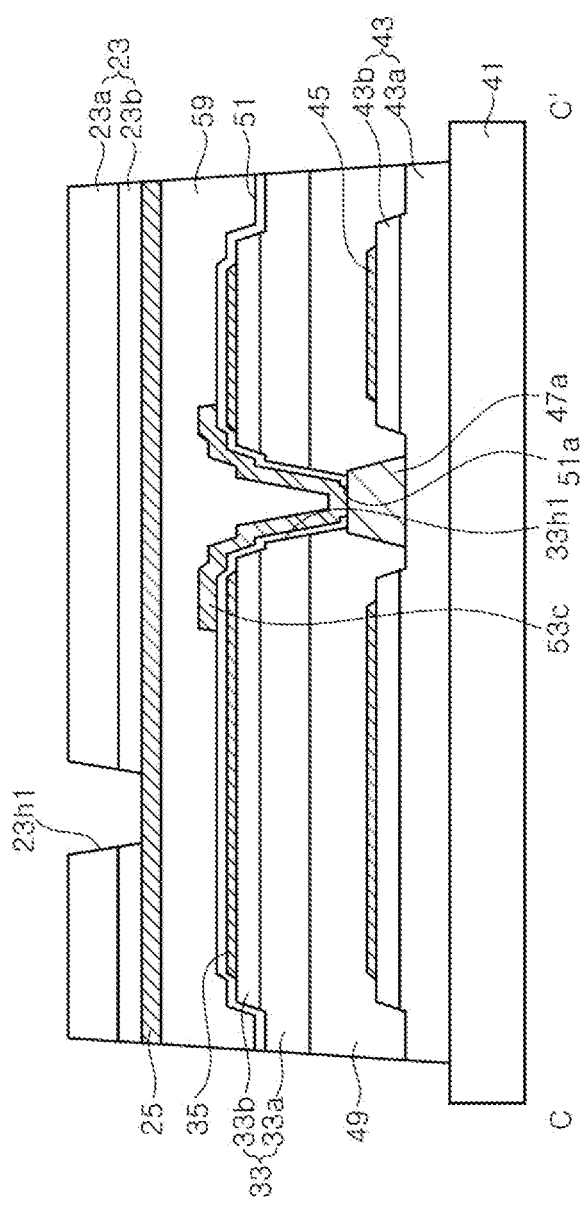
Figure 12A:
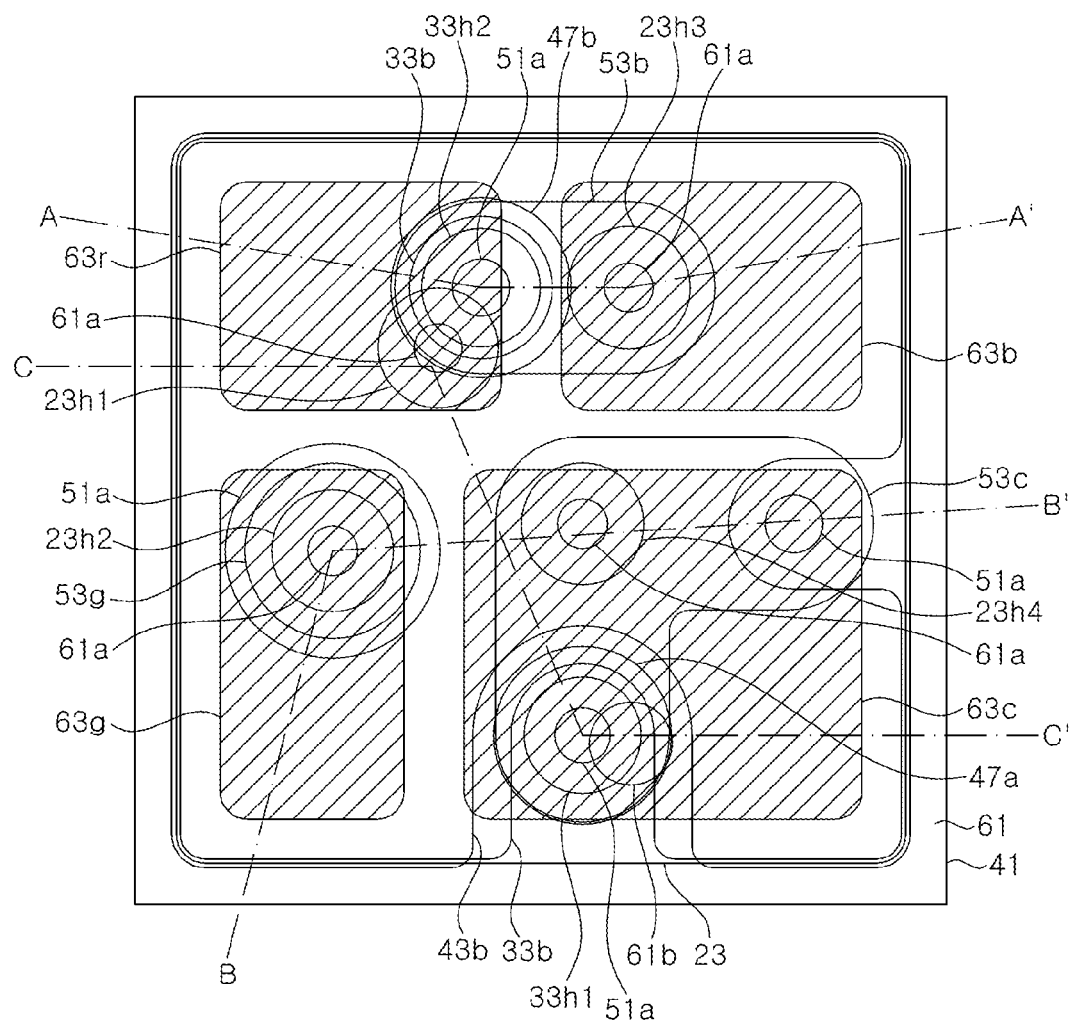
Figure 12B:
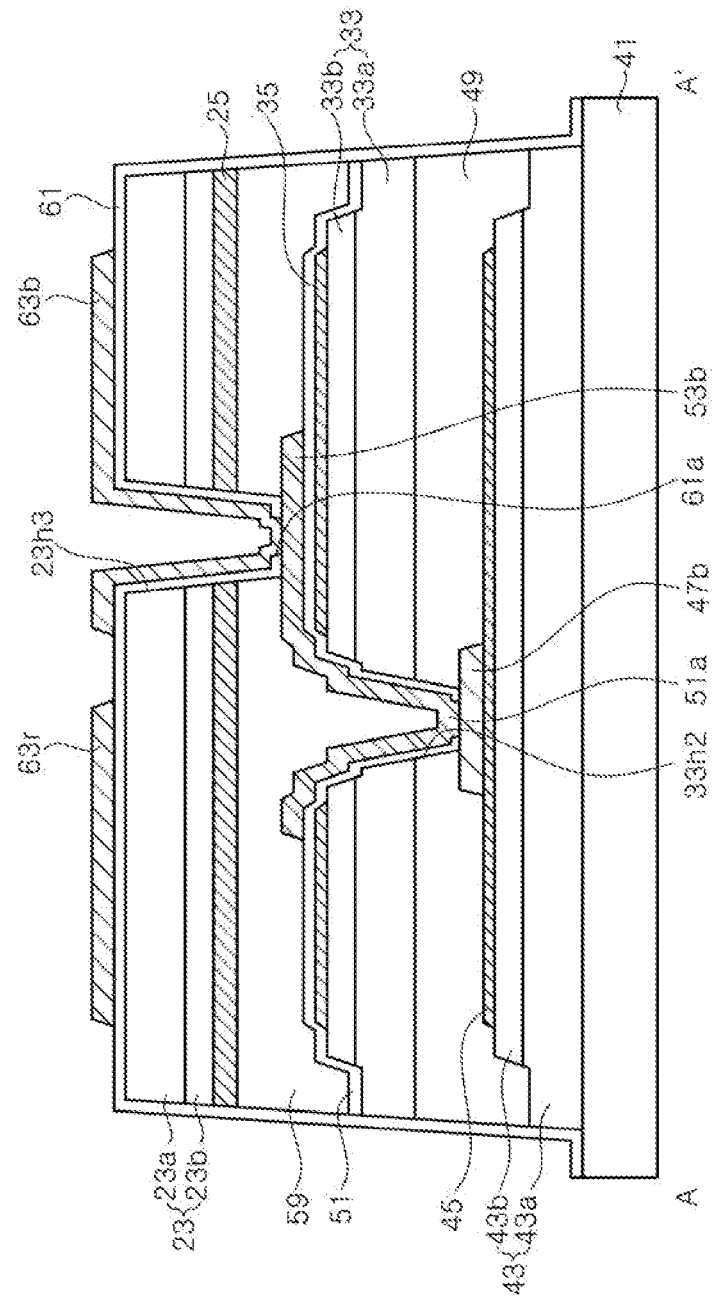
Figure 12C:
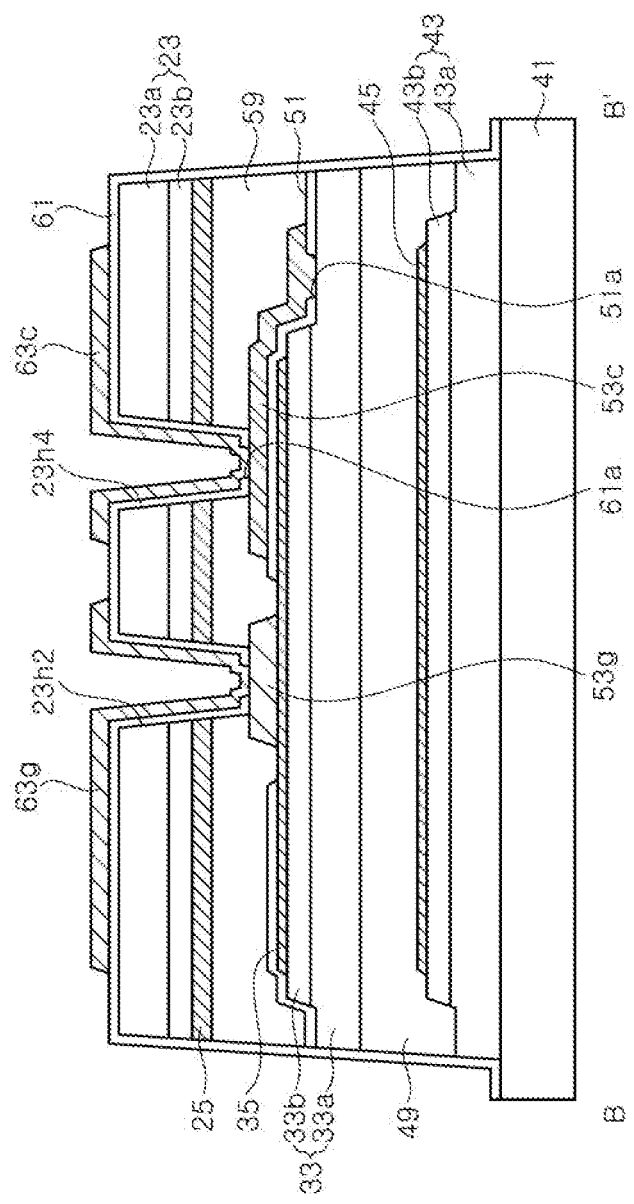
Figure 12D:
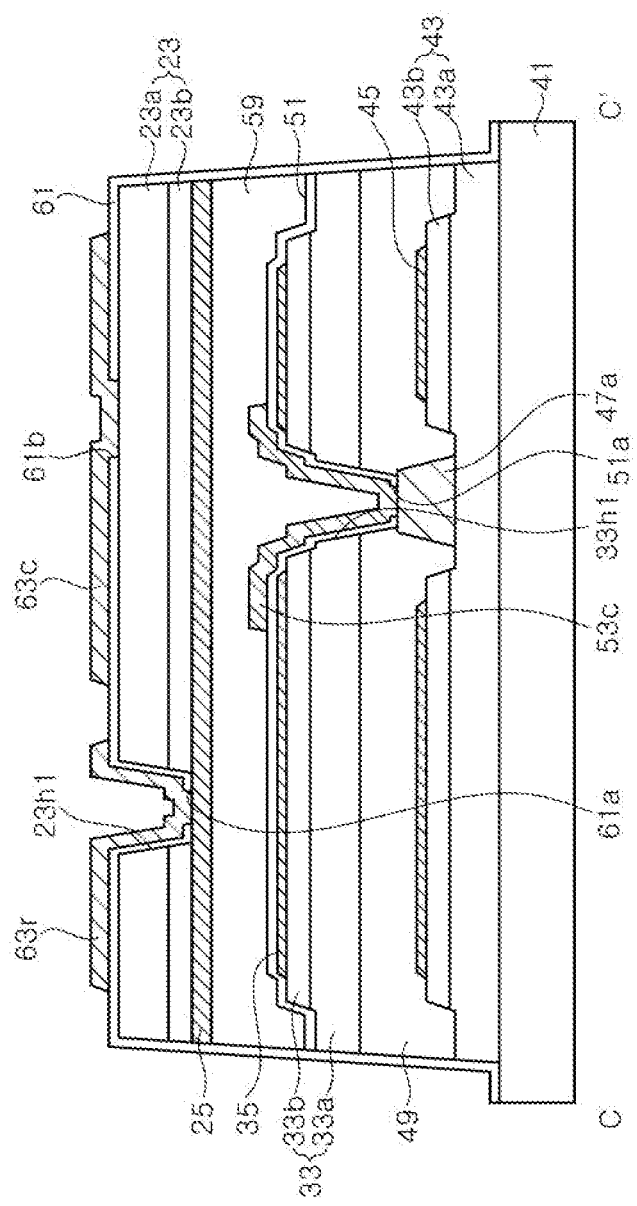
Figure 13A:
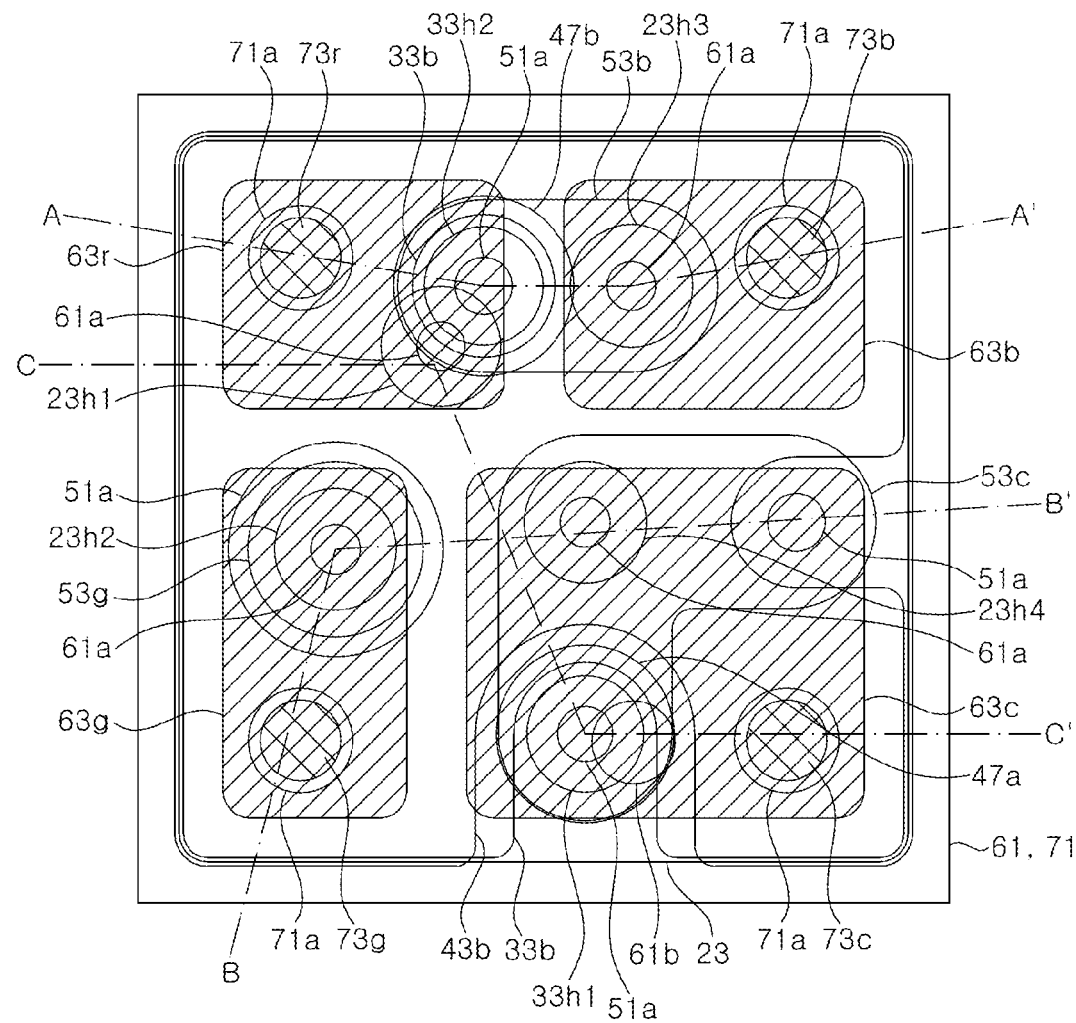
Figure 13B:
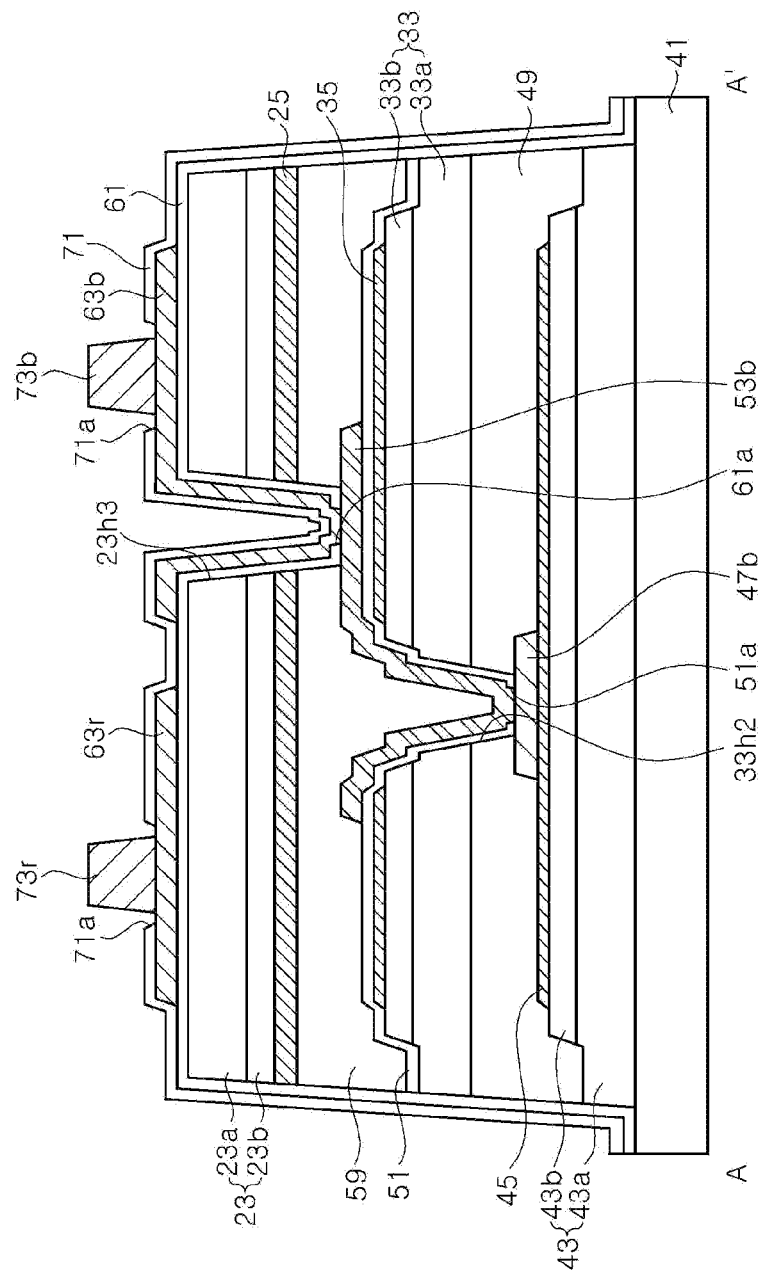
Figure 13C:
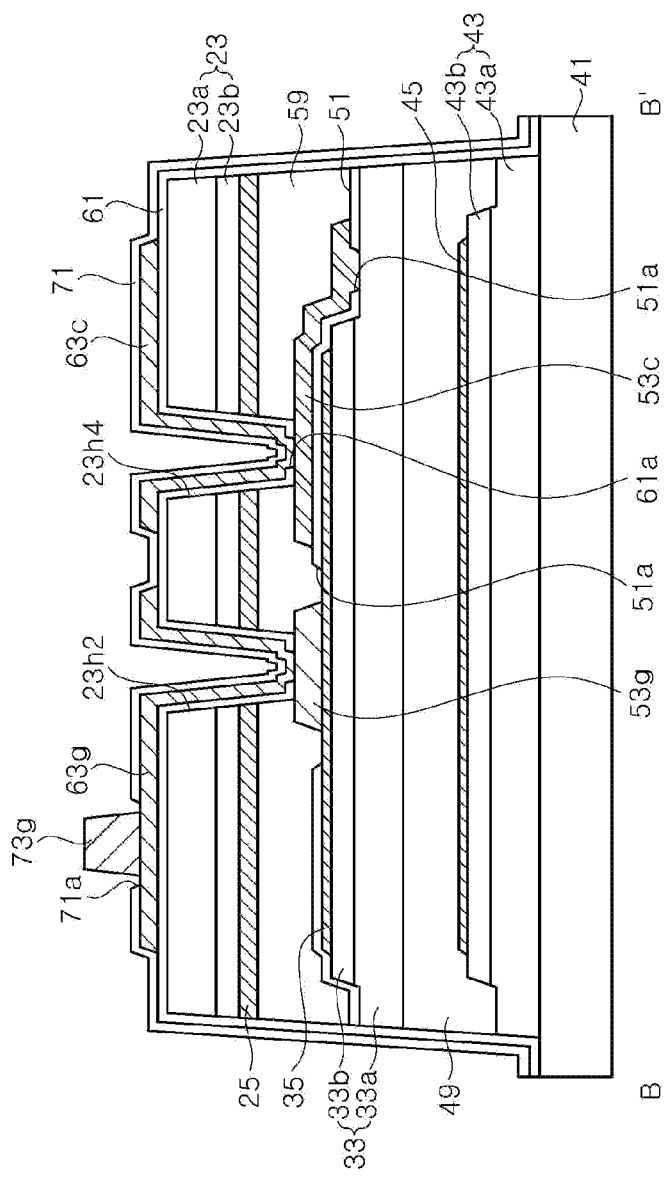
Figure 13D:
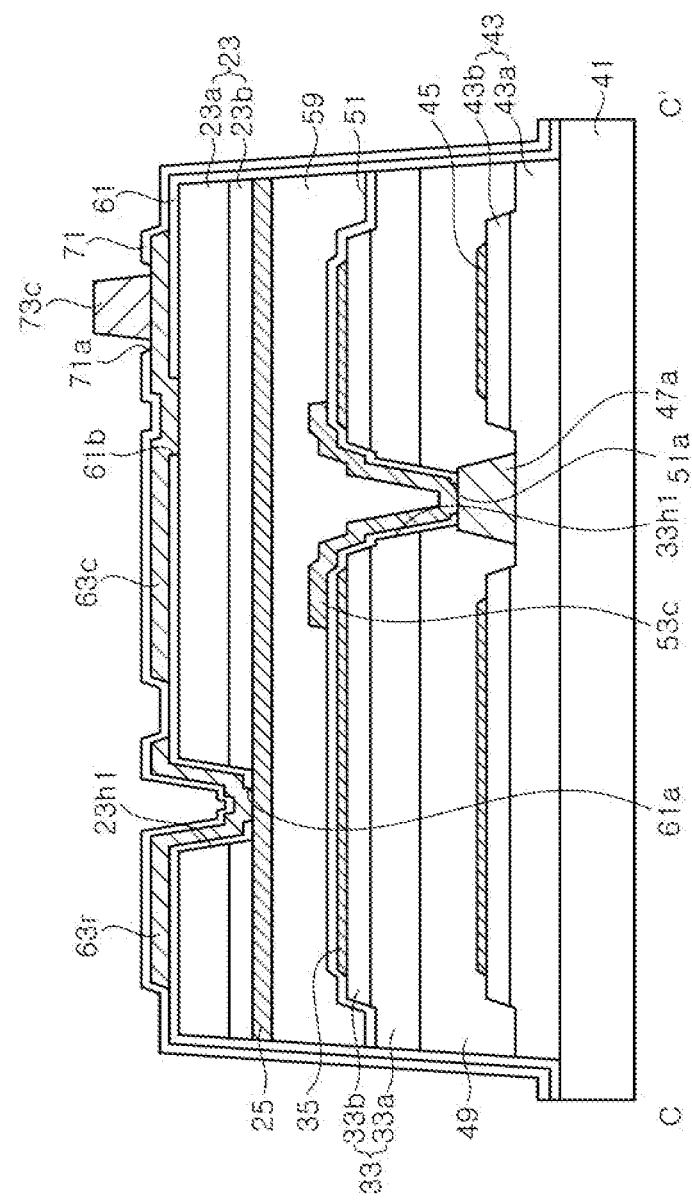

For example, after the etching mask is formed, the second transparent electrode 35 may be etched first by the wet etching technique, and then the second conductivity type semiconductor layer 33b may be etched by the dry etching technique using the same etching mask. Accordingly, the second transparent electrode 35 may be recessed from the mesa etching region. FIG. 6A exemplarily shows an edge of the mesa and does not show an edge of the second transparent electrode 35. However, since the second transparent electrode 35 is wet etched using the same etching mask, the edge of the second transparent electrode 35 is also recessed from the edge of the mesa toward an inner side of the mesa. Since the same etching mask is used, the number of photo processes is not increased, thereby reducing the process cost. However, the inventive concepts are not limited thereto, and the etching mask for etching the mesa etching process and a different etching mask for etching the second transparent electrode 35 may be used, respectively.

As shown in FIG. 6A, a mesa etching region of the second LED stack 33 may be partially overlapped with that of the third LED stack 43. For example, a portion of the mesa etching region of the second LED stack 33 may be formed over the n-electrode pad 47a. In addition, another portion of the mesa etching region thereof may be disposed over the lower p-electrode pad 47b. In addition to this, a portion of the mesa etching region of the second LED stack 33 may be disposed on the mesa region of the third LED stack 43.

Referring to FIG. 7A, FIG. 7B, FIG. 7C, and FIG. 7D, the through holes 33h1 and 33h2 passing through the second LED stack 33 are formed. The through holes 33h1 and 33h2 pass through the first bonding layer 49 to expose the n-electrode pad 47a and the lower p-electrode pad 47b. The through holes 33h1 and 33h2 may be formed in the mesa etching region, and thus, a stepped structure may be formed on sidewalls of the through holes 33h1 and 33h2.

Since the upper surfaces of the lower p-electrode pad 47b and the n-electrode pad 47a are located at substantially the same elevation, any one of the pads may be prevented from being exposed and damaged during the formation of the through holes 33h1 and 33h2.

Referring to FIG. 8A, FIG. 8B, FIG. 8C, and FIG. 8D, a lower insulation layer 51 is formed on the second LED stack 33. The lower insulation layer 51 covers the second transparent electrode 35, and covers the second conductivity type semiconductor layer 33b. In addition, the lower insulation layer 51 covers the sidewalls of the through holes 33h1 and 33h2. The lower insulation layer 51 may have openings 51a exposing the second transparent electrode 35, the first conductivity type semiconductor layer 33a, the n-electrode pad 47a, and the lower p-electrode pad 47b.

Subsequently, a lower common connector 53c, a lower p-connector 53b, and an upper p-electrode pad 53g are formed on the lower insulation layer 51. The lower common connector 53c, the lower p-connector 53b, and the upper p-electrode pad 53g may be formed together with substantially the same material.

An upper p-electrode pad 53g may be disposed on the second transparent electrode 35 exposed by the opening 51a. The lower p-connector 53b is connected to the lower p-electrode pad 47b exposed through the opening 51a, and is also partially disposed on the lower insulation layer 51. The lower common connector 53c is connected to the first conductivity type semiconductor layer 33a and the n-electrode pad 47a exposed through the openings 51a, and a portion of the lower common connector 53c is disposed on the lower insulation layer 51.

Referring to FIG. 9A, FIG. 9B, FIG. 9C, and FIG. 9D, the first LED stack 23 described in FIG. 4A is bonded to the second LED stack 33. The first LED stack 23 and the second LED stack 33 may be bonded using a second bonding layer 59, and the first transparent electrode 25 faces the second LED stack 33. Accordingly, the second bonding layer 59 is in contact with the first transparent electrode 25, also in contact with the lower insulation layer 51, the lower p-connector 53b, the upper p-electrode pad 53g, and the lower common connector 53c, and, further, in contact with the second transparent electrode 35 exposed along a periphery of the upper p-electrode pad 53g. The first substrate 21 is removed from the first LED stack 23. The first substrate 21 may be removed using, for example, an etching technique.

Referring to FIG. 10A, FIG. 10B, FIG. 10C, and FIG. 10D, through holes 23h1, 23h2, 23h3, and 23h4 passing through the first LED stack 23 are formed. The through hole 23h1 exposes the first transparent electrode 25, and the through holes 23h2, 23h3, and 23h4 pass through the second bonding layer 59 to expose the upper p-electrode pad 53g, the lower p-connector 53b, and the lower common connector 53c, respectively. Since the through holes 23h1 and the through holes 23h2, 23h3, and 23h4 have different depths, they may be formed by different processes. Meanwhile, the through holes 23h2, 23h3, and 23h4 may be formed together in the same process because the depths thereof are substantially the same.

The through holes 23h1, 23h2, 23h3, and 23h4 may be formed to pass through the entire first LED stack 23, and thus, sidewalls of the through holes may be formed without steps, unlike those of the through holes 33h1 and 33h2.

Referring to FIG. 11A, FIG. 11B, FIG. 11C, and FIG. 11D, an isolation trench is formed to define a region of the light emitting device 100 by an isolation process. The isolation trench may expose the substrate 41 along peripheries of the first to third LED stacks 23, 33, and 43. Between regions of the light emitting device, the isolation trench may be formed by sequentially removing the first LED stack 23, the first transparent electrode 25, the second bonding layer 59, the lower insulation layer 51, the second LED stack 33, the first bonding layer 49, and the third LED stack 43. The second transparent electrode 35 and the third transparent electrode 45 are not exposed during the isolation process, and thus, may not be damaged by etching gas. When the second and third transparent electrodes 35 and 45 are formed of ZnO, ZnO may be easily damaged by etching gas. However, the second and third transparent electrodes 35 and 45 may not be exposed to an etching gas by forming the second and third transparent electrodes 35 and 45 to be recessed inwardly.

In the illustrated exemplary embodiment, the first to third LED stacks 23, 33, and 43 are described as being sequentially patterned through the isolation process, but the inventive concepts are not limited thereto. For example, in some exemplary embodiments, the third LED stack 43 may be removed in advance in a region where the isolation trench is to be formed before bonding the second LED stack 33, or the second LED stack 33 may be removed in advance in the region in which the isolation trench is to be formed before bonding the first LED stack 23. In this case, the region where the third LED stack 43 is removed may be filled with the first bonding layer 49, and the region where the second LED stack 33 is removed may be filled with the second bonding layer 59. Accordingly, the second and third LED stacks 33 and 43 may not be exposed in the isolation process.

In another exemplary embodiment, the isolation process may be omitted. In this case, the light emitting devices may be separated from one another in a chip dividing process.

Referring to FIG. 12A, FIG. 12B, FIG. 12C, and FIG. 12D, an intermediate insulation layer 61 is formed on the first LED stack 23. The intermediate insulation layer 61 may cover side surfaces of the first to third LED stacks 23, 33, and 43, side surfaces of the first and second bonding layers 49 and 59, a side surface of the transparent electrode 25, and a side surface of the lower insulation layer 51 exposed through the isolation trench, and may cover an upper surface of the substrate 41.

The intermediate insulation layer 61 may also cover sidewalls of the through holes 23h1, 23h2, 23h3, and 23h4. However, the intermediate insulation layer 61 is patterned to have openings 61a exposing bottoms of the through holes 23h1, 23h2, 23h3, and 23h4, and an opening 61b exposing the first conductivity type semiconductor layer 23a of the first LED stack 23. The openings 61a expose the first transparent electrode 25, the upper p-electrode pad 53g, the lower p-connector 53b, and the lower common connector 53c in the through holes 23h1, 23h2, 23h3, and 23h4.

First to third upper connectors 63r, 63g, and 63b, and an upper common connector 63c are formed on the intermediate insulation layer 61. The first upper connector 63r is connected to the first transparent electrode 25, the second upper connector 63g is connected to the upper p-electrode pad 53g, and the third upper connector 63b is connected to the lower p-connector 53b. Meanwhile, the upper common connector 63c may be connected to the lower common connector 53c.

Referring to FIG. 13A, FIG. 13B, FIG. 13C, and FIG. 13D, an upper insulation layer 71 is formed to cover the intermediate insulation layer 61 and the connectors 63r, 63g, 63b, and 63c. The upper insulation layer 71 may also cover the intermediate insulation layer 61 on the side surfaces of the first to third LED stacks 23, 33, and 43 and on the substrate 41. However, the upper insulation layer 71 may be patterned to have openings 71a exposing the first to third upper connectors 63r, 63g and 63b, and the upper common connector 63c.

Subsequently, bump pads 73r, 73g, 73b, and 73c are formed in the openings 71a, respectively. The first bump pad 73r is disposed on the first upper connector 63r, the second bump pad 73g is disposed on the second upper connector 63g, and the third bump pad 73b is disposed on the third upper connector 63b. The common bump pad 73c is disposed on the upper common connector 63c.

Then, light emitting devices 100 are individualized by dividing the substrate 41, and these individual light emitting devices 100 are bonded onto the circuit board 101. A schematic cross-sectional view of the light emitting device 100 bonded to the circuit board 101 is shown in FIG. 14.

Figure 14:
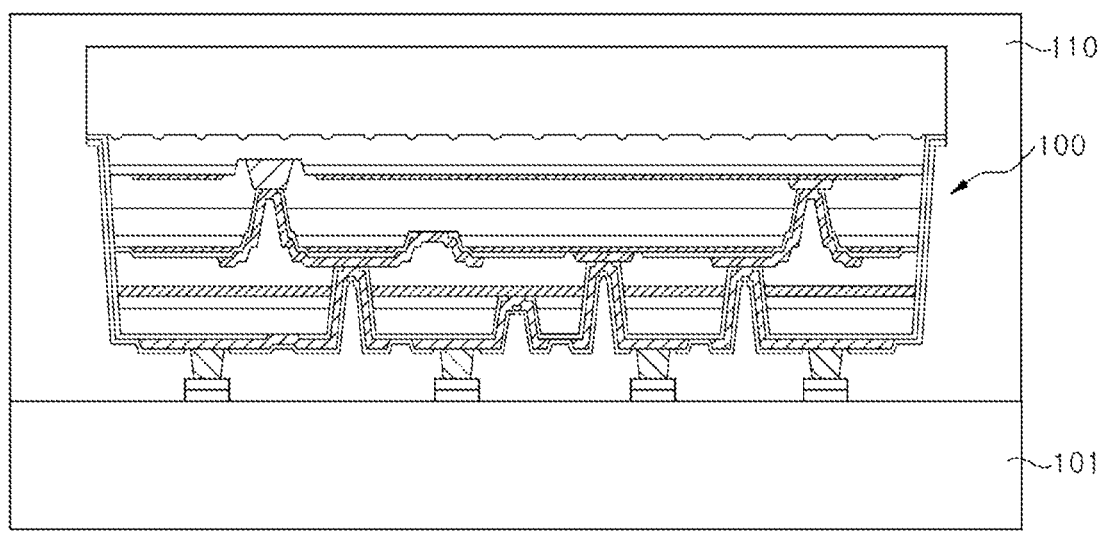
FIG. 14 is a schematic cross-sectional view illustrating a light emitting device mounted on a circuit board.

Although FIG. 14 exemplarily illustrates a single light emitting device 100 disposed on the circuit board 101, however, a plurality of light emitting devices 100 may be mounted on the circuit board 101. Each of the light emitting devices 100 may form one pixel capable of emitting blue light, green light, and red light, and a plurality of pixels are arranged on the circuit board 101 to provide a display panel.

The light emitting device 100 may be covered with a black material film 110. The black material film 110 may be used to prevent optical interference between the light emitting devices 100. A thickness of the black material film 110 on the light emitting device 100 is less than that of the black material film 110 on the side surface of the light emitting device 100, and, accordingly, light may be emitted in an upper direction of the light emitting device 100, and light traveling toward the side surface thereof is absorbed by the black material film 110.

The plurality of light emitting devices 100 may be formed on the substrate 41, and the light emitting devices 100 may be transferred onto the circuit board 101 in a group, not individually. The substrate 41, on which the plurality of light emitting devices 100 is formed is generally referred to as a wafer. As such, the wafer includes the substrate 41, the first to third LED stacks disposed on the substrate 41, and the bump pads formed in each region of the light emitting devices. FIG. 15A through FIG. 15I are schematic cross-sectional views illustrating a method of transferring the light emitting device 100 to the circuit board. Hereinafter, a method of transferring the light emitting devices 100 formed on the substrate 41 to the circuit board 101 in a group will be described Referring to FIG. 15A, when the processes of manufacturing the light emitting devices are completed as shown in FIG. 13A, FIG. 13B, FIG. 13C, and FIG. 13D, the wafer in which the plurality of light emitting devices 100 are formed on a single substrate 41 is provided. Although the drawings exemplarily illustrate 10 regions of the light emitting device, more regions of the light emitting device may be included on the single substrate 41. Furthermore, the substrate 41 may be formed thinner through a thinning process.

Scribing lines are formed on the substrate 41 through laser scribing. The scribing line may be formed on an upper surface of the substrate 41 or may be formed on a lower surface of the substrate 41. The region of the light emitting device 100 is defined by the scribing lines.

Figure 15A:
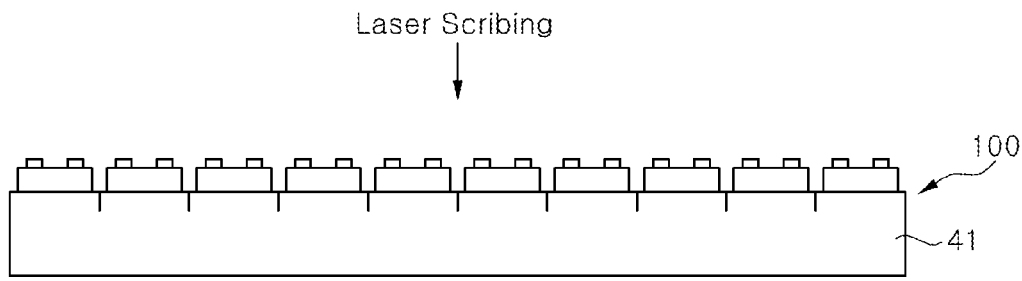
FIGS. 15A, 15B, 15C, 15D, 15E, 15F, 15G, 15H, and 15I are schematic cross-sectional views illustrating a method of transferring a light emitting device to a circuit board according to an exemplary embodiment.
Figure 15B:
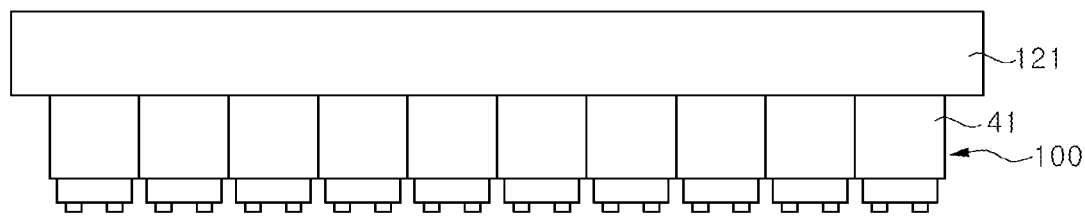

Referring to FIG. 15B, the light emitting devices 100 are divided along the scribing lines through a breaking process. The substrate 41 on which scribing grooves are formed through laser scribing may be broken using a blade or the like. The substrate 41 on which the scribing grooves are formed may be cracked along the scribing grooves by the blade impacting or applying pressure to the substrate 41 while the scribing grooves are attached to a breaking tape 121. Accordingly, the light emitting devices 100 are individualized in chip units along the scribing lines.

In general, after the breaking process is completed, the breaking tape is typically expanded to place the light emitting devices 100 far from one another. However, in the illustrated exemplary embodiment, the conventional expansion process may be omitted.

Figure 15C:
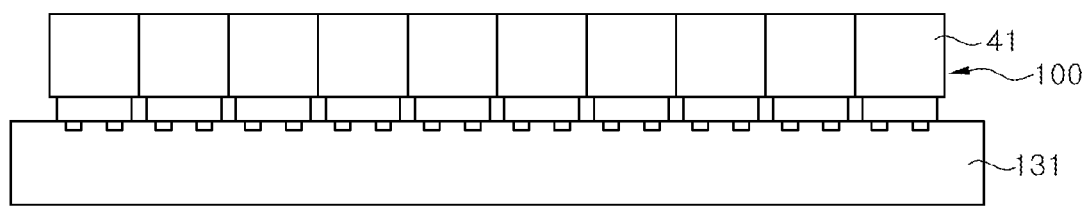

Referring to FIG. 15C, the light emitting devices 100 completed with the breaking process are transferred onto a temporary substrate 131 while maintaining their locational relationship. The temporary substrate 131 may include a transfer tape on an upper surface thereof. The temporary substrate 131 is used to change the vertical direction of the substrate 41 and the bump pad. More particularly, the bump pads of the light emitting devices 100 may be temporarily bonded to the transfer tape of the temporary substrate 131.

Figure 15D:
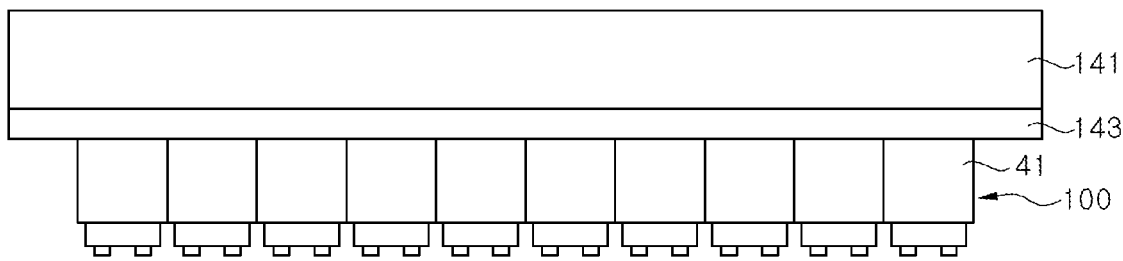
Figure 15E:
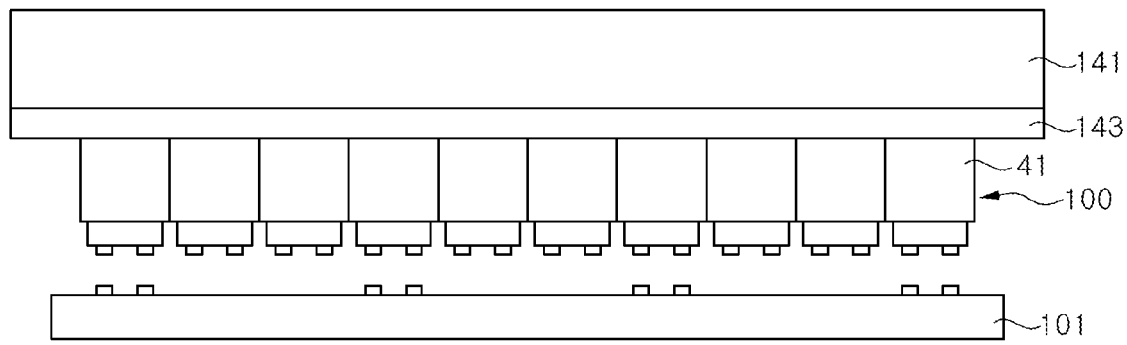

Referring to FIG. 15D, the light emitting devices 100 are transferred onto a supporting substrate 141 while maintaining the locational relationship of the light emitting devices 100 attached to the temporary substrate 131. A transfer tape 143 is disposed on the supporting substrate 141, and thus, the substrate 41 is attached to the transfer tape 143 of the supporting substrate 141. In this case, the bump pads of the light emitting devices 100 face away the transfer tape 143.

In the illustrated exemplary embodiment, the transfer tape 143 may have different adhesive forces depending on temperature. For example, as the temperature decreases, the adhesive force may become greater, and, as the temperature increases, the adhesive force may become less. In particular, the bump pads may be bonded to the circuit board 101 by applying heat, and the adhesive force of the transfer tape 143 at a bonding temperature is less than that at room temperature.

The transfer tape 143 may be, for example, a tape including an acrylic or silicone adhesive, but is not limited thereto. The transfer tape 143 may have heat resistance capable of maintaining a certain degree of adhesive force at the bonding temperature.

Referring to FIG. 15D, the circuit board 101 having pads on an upper surface thereof is provided. The pads are arranged on the circuit board 101 to correspond to locations where the pixels for a display are to be arranged. In general, an interval between the light emitting devices 100 arranged on the substrate 41 may be more dense than that of the pixels in the circuit board 101.

Figure 15F:
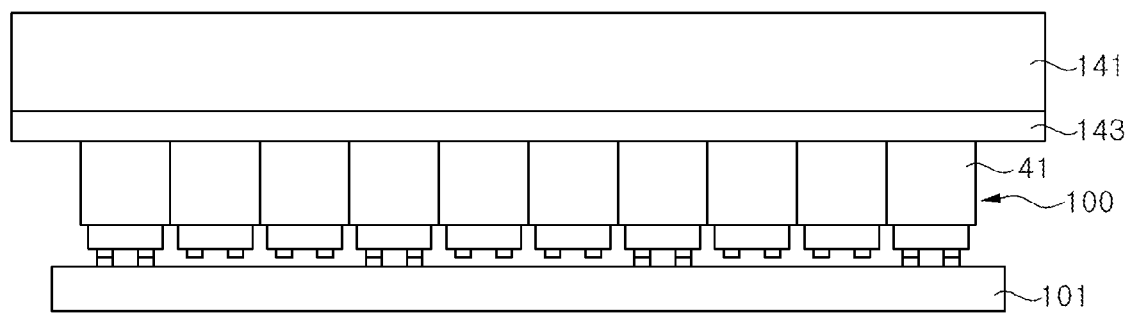

Referring to FIG. 15F, the bump pads of the light emitting devices 100 are bonded to the pads of the circuit board 101. The supporting substrate 141 and the circuit board 101 are brought closer to each other so that the bump pads of the light emitting devices 100 contact the pads of the circuit board 101. Then, the bump pads and the pads may be bonded to each other by applying heat to the bump pads and the pads while pressing the supporting substrate 141 towards the circuit board 101. For example, heat may be transferred to the bump pads and the pads by heating a header portion holding the supporting substrate 141 and a loading portion loaded with the circuit board 101, and, accordingly, heat may be applied to the bump pads and the pads. The bump pads and pads may be bonded using, for example, In, Pb, AuSn, or CuSn bonding. In bonding may be generally bonded in a range of about 150° C. to about 200° C., AuSn at about 300° C., and CuSn in a range of 200° C. to 250° C. Meanwhile, the light emitting devices 100 located between pixel regions are retained on the supporting substrate 141 to be spaced apart from the circuit board 101, since these light emitting devices 100 do not have corresponding pads to be bonded.

While heat is applied, metal bonding may occur between the metals of the pads and the bump pads. After a predetermined time for bonding, the metal bonding is completed at the bonding temperature, and a bonding force between the bump pads and the pads of the circuit board 101 may be increased.

Figure 15G:
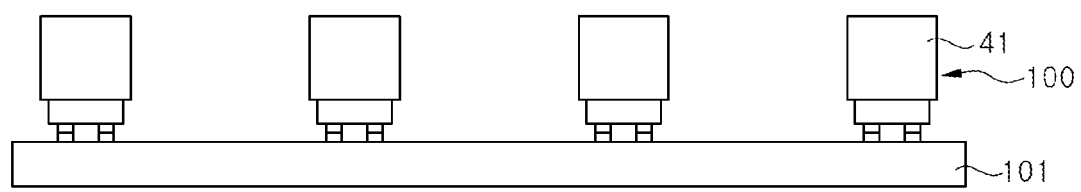

Referring to FIG. 15G, the light emitting devices 100 bonded to the pads are selectively transferred to the circuit board 101 by separating the light emitting devices 100 from the supporting substrate 141 and the transfer tape 143. Accordingly, the display panel in which the light emitting devices 100 are arranged on the circuit board 101 is provided.

In one exemplary embodiment, the light emitting devices 100 may be separated from the transfer tape 143 of the supporting substrate 141 at the bonding temperature. In this case, an adhesive force between the transfer tape 143 and the light emitting device 100 at the bonding temperature is less than that between the bump pads of the light emitting devices 100 and the pads of the circuit board 101, and, accordingly, the light emitting devices 100 bonded to the pads are transferred onto the circuit board 101.

In another exemplary embodiment, after bonding between the light emitting devices 100 and the circuit board 101 is completed at the bonding temperature, a bonding substance may be cooled, which may be cooled to an intermediate temperature higher than room temperature but lower than the bonding temperature. The light emitting devices 100 may be separated from the transfer tape 143 of the supporting substrate 141 at this intermediate temperature and transferred onto the circuit board 101. The transfer tape 143 has a relatively low adhesive force at the intermediate temperature compared to that at room temperature. In particular, the adhesive force between the transfer tape 143 and the light emitting device 100 at the intermediate temperature may be less than that between the bump pads of the light emitting devices 100 and the pads of the circuit board 101, and, accordingly, the light emitting devices 100 may be easily transferred from the transfer tape 143 to the circuit board 101 at the intermediate temperature.

Meanwhile, when the transfer tape 143 is cooled to room temperature, the adhesive force increases, and thus, the light emitting devices 100 remaining on the supporting substrate 141 may be stably maintained.

According to the illustrated exemplary embodiment, since the light emitting devices 100 separated into individual chips through laser scribing and breaking processes are transferred to the transfer tape, while maintaining the locational relationship, the conventional rearrangement process may be omitted, and, accordingly, process time may be shortened.

Furthermore, since the light emitting device 100 includes the first to third LED stacks 23, 33, and 43 stacked one over another, only one light emitting device 100 may be mounted on each pixel to provide the display apparatus, rather than mounting the light emitting device for each sub-pixel, thereby further shortening the mounting process time.

Figure 15H:
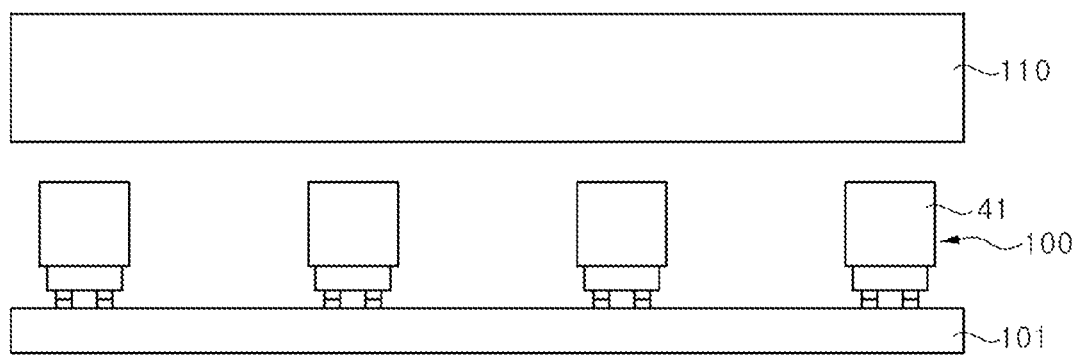

Next, referring to FIG. 15H, the black material film 110 covers the light emitting devices 100 on the circuit board 101. The black material film 110 may be attached onto the light emitting devices 100 through a vacuum lamination process, and, accordingly, the black material film 110 may be brought into close contact to the light emitting devices 100 and the circuit board 101.

Figure 15I:
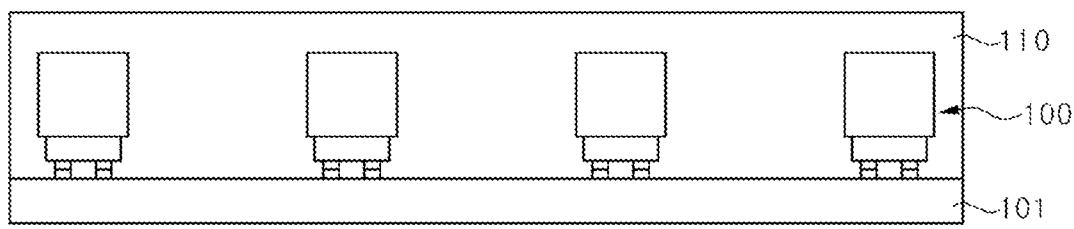

Referring to FIG. 15I, after the black material film 110 is brought into close contact to the light emitting devices 100, the black material film 110 disposed on the light emitting devices 100 may be flattened using rolling or the like. Accordingly, the thickness of the black material film 110 above the light emitting devices 100 may be reduced, and regions between the light emitting devices 100 may be filled with the black material film 110.

In this manner, a display panel may be formed, and the display panel may be mounted on various display apparatuses as shown in FIG. 1.

Figure 16A:
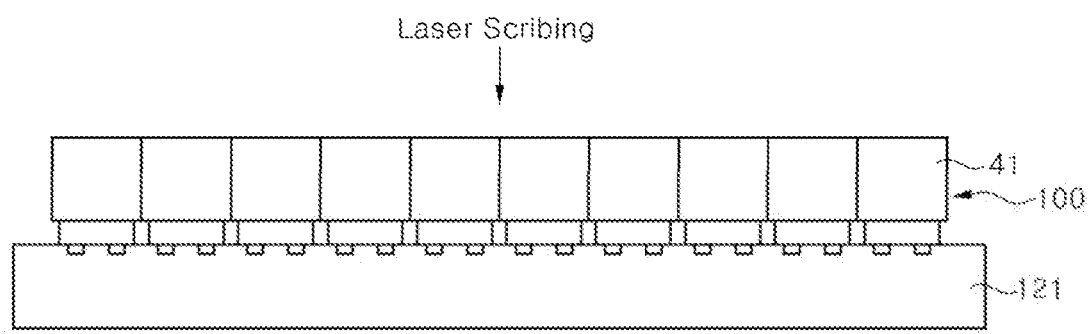
FIG. 16A and FIG. 16B are schematic cross-sectional views illustrating a method of transferring a light emitting device to a circuit board according to another exemplary embodiment.
Figure 16B:
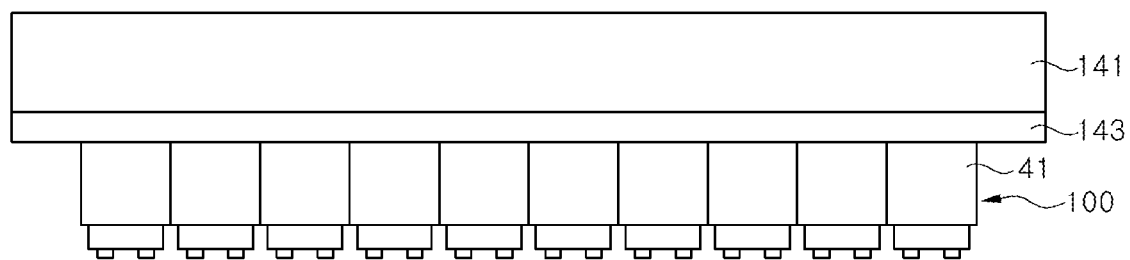

FIG. 16A and FIG. 16B are schematic cross-sectional views illustrating a method of transferring a light emitting device to a circuit board according to another exemplary embodiment.

Referring to FIG. 16A, a transferring method according to the illustrated exemplary embodiment is generally similar to the transfer method described above with reference to FIGS. 15A through 15I, except that the breaking process using the blade is omitted.

More particularly, in the illustrated exemplary embodiment, the breaking may be performed by laser scribing. Referring back to FIG. 15A, the laser scribing process forms the scribing grooves on the upper or lower surface of the substrate 41, but in the illustrated exemplary embodiment, the laser scribing passes through the substrate 41. This laser scribing may be performed by dividing the substrate 41 using the laser described with reference to FIG. 15A, or may be performed by irradiating a laser into the substrate 41 using a stealth laser.

In addition, since the light emitting devices 100 are separated through laser scribing, the scribing process is performed while the light emitting devices 100 are attached to the tape 121. In this case, the laser scribing may be performed while the bump pads of the light emitting devices 100 face the tape 121 and the substrate 41 is disposed at an upper side.

Referring to FIG. 16B, the light emitting devices 100 divided into individual chips through laser scribing are transferred to the transfer tape 143 on the supporting substrate 141 while maintaining their locational relationship. Therefore, in the illustrated exemplary embodiment, the process of transferring the light emitting devices 100 to a temporary substrate (e.g., the temporary substrate 131 of FIG. 15C) may be omitted.

Subsequently, as described with reference to FIGS. 15E through 15I, the light emitting devices 100 may be transferred to the circuit board 101.

Figure 17A:
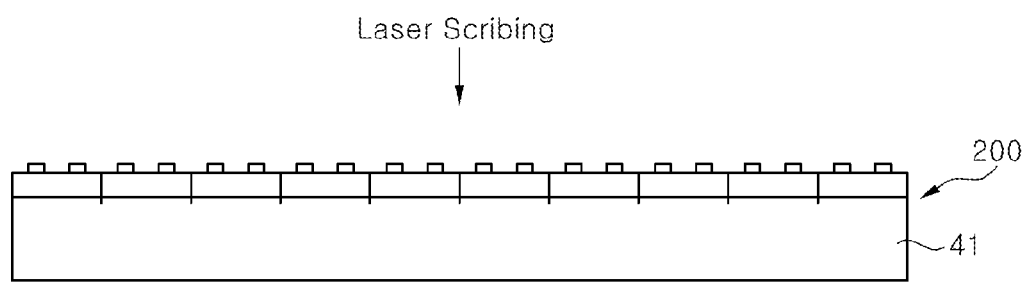
FIG. 17A and FIG. 17B are schematic cross-sectional views illustrating a method of transferring a light emitting device to a circuit board according to another exemplary embodiment.
Figure 17B:
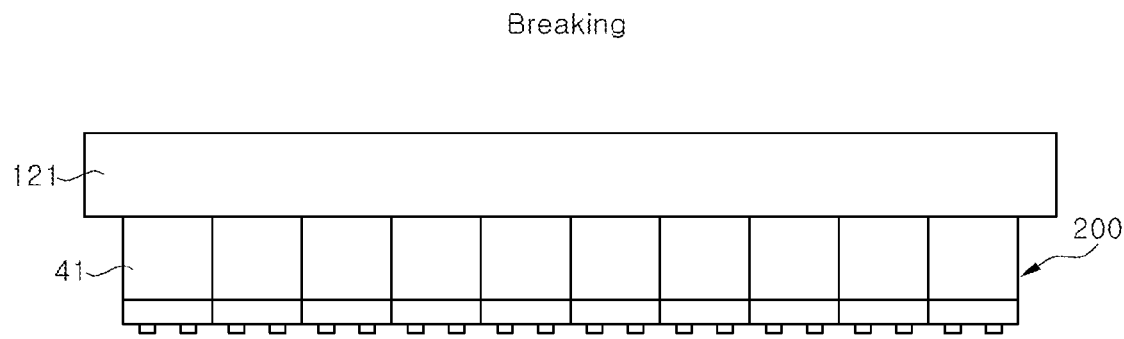

FIG. 17A and FIG. 17B are schematic cross-sectional views illustrating a method of transferring a light emitting device to a circuit board according to another exemplary embodiment.

In the above exemplary embodiments, the first to third LED stacks 23, 33, and 43 formed on the substrate 41 are described as being previously separated into the region of the light emitting device by forming the isolation trench through the isolation process, and then the laser scribing process is performed for individualization. However, in another exemplary embodiment, the isolation process may be omitted, and the region of the light emitting device may be formed through scribing and breaking. FIG. 17A and FIG. 17B show views illustrating a method of transferring a light emitting device 200 to the circuit board 101 from a wafer formed without undergoing the isolation process.

Referring to FIG. 17A, the wafer in which the first to third LED stacks 23, 33, and 43 are stacked to overlap each other on the substrate 41 is provided through the process as described above, except that the insolation process has not been performed. As such, a plurality of light emitting devices 200 are formed on the substrate 41, and bump pads are disposed to correspond to each light emitting device.

Next, scribing grooves are formed in the wafer through laser scribing. The scribing grooves may be formed by passing through at least a portion of the first to third LED stacks 23, 33, and 43, and may also be formed on a portion of the upper surface of the substrate 41.

Referring to FIG. 17B, after the scribing grooves are formed, the substrate 41 is attached to the breaking tape 121, and as described with reference to FIG. 15B, breaking is performed using a blade or the like. Subsequently, the light emitting devices 200 may be transferred onto the circuit board 101 through the process as described with reference to FIGS. 15C through 15I.

In the illustrated exemplary embodiment, although both of the laser scribing and the breaking processes have been described as being performed on the light emitting device 200, however, as described with reference to FIG. 16A and FIG. 16B, in other exemplary embodiments, the light emitting devices 200 may be separated through laser scribing, and, accordingly, the breaking process may be omitted.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art

What is claimed is:
1. A light emitting display comprising:
  a circuit board;
  a plurality of light emitting devices arranged on the circuit board, each of the light emitting devices including a first light emitting diode (LED) stack, a second LED stack, and a third LED stack;

a bump pad disposed between the circuit board and each light emitting device of the plurality of light emitting devices, the bump pad comprising Au material; and
an encapsulation layer comprising an optical interference preventing material and covering the light emitting devices,
wherein:
the circuit board includes an interconnection line and a plurality of pads disposed on an upper surface thereof to provide electrical connection;
the first, second, and third LED stacks are stacked in a vertical direction;
one of the LED stacks configured to emit light having a longest wavelength among the first, second, and third LED stacks is in ohmic contact with the Au material;
the encapsulation layer is in direct contact with the circuit board; and
the bump pad has an irregular upper surface.

2. The light emitting display of claim 1, further comprising a common bump pad, wherein:
the second LED stack is disposed between the first LED stack and the third LED stack;
the first LED stack is disposed closer to the circuit board than the third LED stack;
each of the first, second, and third LED stacks includes a first conductivity type semiconductor layer, an active layer, and a second conductivity type semiconductor layer;
the common bump pad is commonly electrically connected to the first, second, and third LED stacks; and
the bump pad is electrically connected to one of the first, second, and third LED stacks.

3. The light emitting display of claim 2, wherein each light emitting device of the plurality of light emitting devices further includes:
a first transparent electrode interposed between the first LED stack and the second LED stack, and being in ohmic contact with a lower surface of the first LED stack;
a second transparent electrode interposed between the first LED stack and the second LED stack, and being in ohmic contact with an upper surface of the second LED stack;
a third transparent electrode interposed between the second LED stack and the third LED stack, and being in ohmic contact with an upper surface of the third LED stack;
a first electrode pad disposed on the first conductivity type semiconductor layer of the third LED stack; and
a lower second electrode pad disposed on the third transparent electrode.

4. The light emitting display of claim 3, wherein an upper surface of the first electrode pad of each light emitting device of the plurality of light emitting devices is located at substantially the same elevation as that of the lower second electrode pad.

5. The light emitting display of claim 3, wherein:
each of the first, second, and third transparent electrodes contacts the corresponding second conductivity type semiconductor layer of each of the first, second, and third LED stacks; and
at least one of the first, second, and third transparent electrodes is recessed from an edge of each of the corresponding second conductivity type semiconductor layer of the first, second, and third LED stacks.

6. The light emitting display of claim 2, wherein each light emitting device of the plurality of light emitting devices further comprises:
a first bonding layer interposed between the second LED stack and the third LED stack; and
a second bonding layer interposed between the first LED stack and the second LED stack.

7. The light emitting display of claim 1, wherein the bump pad includes a plurality of conductive layers including metal.

8. The light emitting display of claim 7, wherein a layer including the Au material of a light emitting device of the plurality of light emitting devices has a greatest thickness among the plurality of conductive layers.

9. The light emitting display of claim 1, wherein the bump pad and one of the pads are bonded with at least one of In, Pb, AuSn, and CuSn.

10. The light emitting display of claim 1, wherein each of the light emitting devices further includes a growth substrate on which the third LED stack is grown.

11. A light emitting display comprising:
a circuit board;
a plurality of light emitting devices arranged on the circuit board, each of the light emitting devices including a first light emitting diode (LED) stack, a second LED stack, and a third LED stack;
a bump pad disposed between the circuit board and each light emitting device of the plurality of light emitting devices, the bump pad comprising Au material; and
an encapsulation layer comprising an optical interference preventing material and covering the light emitting devices,
wherein:
the circuit board includes an interconnection line and pads disposed on an upper surface thereof to provide electrical connection;
the first, second, and third LED stacks include an inorganic light source;
one of the LED stacks configured to emit light having a longest wavelength among the first, second, and third LED stacks electrically contacts the Au material;
the encapsulation layer is in direct contact with the circuit board; and
the bump pad has an irregular upper surface.

12. The light emitting display of claim 11, wherein the bump pad includes a plurality of conductive layers including metal.

13. The light emitting display of claim 12, wherein a layer including the Au material of a light emitting device of the plurality of light emitting devices has a greatest thickness among the plurality of conductive layers.

14. The light emitting display of claim 11, wherein the bump pad and one of the pads are bonded with at least one of In, Pb, AuSn, and CuSn.

15. The light emitting display of claim 11, wherein each of the light emitting devices further includes a growth substrate on which the third LED stack is grown.

16. A light emitting display comprising:
a circuit board;
a plurality of light emitting devices arranged on the circuit board, each of the light emitting device including a first light emitting diode (LED) stack, a second LED stack, and a third LED stack;
a bump pad disposed between the circuit board and each light emitting device of the plurality of light emitting devices, the bump pad comprising Au material; and an encapsulation layer comprising an optical interference preventing material and covering the light emitting devices, wherein:

the circuit board includes an interconnection line and pads disposed on an upper surface thereof to provide electrical connection;

the first, second, and third LED stacks include Ga and In materials;

one of the LED stacks configured to emit light having a longest wavelength among the first, second, and third LED stacks electrically contacts the Au material;

the encapsulation layer is in direct contact with the circuit board; and the bump pad has an irregular upper surface.

17. The light emitting display of claim 16, wherein the bump pad includes a plurality of conductive layers including metal.

18. The light emitting display of claim 17, wherein a layer including the Au material of one light emitting device of the plurality of light emitting devices has a greatest thickness among the plurality of conductive layers.

19. The light emitting display of claim 17, wherein the bump pad and one of the pads are bonded with at least one of In, Pb, AuSn, and CuSn.

20. The light emitting display of claim 17, wherein each of the light emitting devices further includes a growth substrate on which the third LED stack is grown.

* * * * *